(12) United States Patent
Nakao et al.

(10) Patent No.: US 8,206,197 B2
(45) Date of Patent: Jun. 26, 2012

(54) POLISHING APPARATUS AND PROGRAM THEREOF

(75) Inventors: Hidetaka Nakao, Tokyo (JP); Masafumi Inoue, Tokyo (JP); Koichi Takeda, Tokyo (JP)

(73) Assignee: Ebara Corporation, Tokyo (JP)

( * ) Notice: Subject to any disclaimer, the term of this patent is extended or adjusted under 35 U.S.C. 154(b) by 470 days.

(21) Appl. No.: 12/596,333

(22) PCT Filed: Apr. 17, 2008

(86) PCT No.: PCT/JP2008/057881
§ 371 (c)(1),
(2), (4) Date: Oct. 16, 2009

(87) PCT Pub. No.: WO2008/133286
PCT Pub. Date: Nov. 6, 2008

(65) Prior Publication Data
US 2010/0130103 A1    May 27, 2010

(30) Foreign Application Priority Data
Apr. 20, 2007   (JP) ................................. 2007-111848

(51) Int. Cl.
B24B 49/00    (2006.01)
B24B 1/00    (2006.01)

(52) U.S. Cl. ...................... 451/5; 451/8; 451/57; 451/65

(58) Field of Classification Search .................. 451/5, 8, 451/28, 41, 54, 57, 65, 287
See application file for complete search history.

(56) References Cited

U.S. PATENT DOCUMENTS 6,074,276 A * 6/2000 Shibata et al. .................... 451/8
6,201,999 B1    3/2001 Jevtic
(Continued)

FOREIGN PATENT DOCUMENTS

| JP | 2002-511193 | 4/2002 |
| JP | 2004-241457 | 8/2004 |
| JP | 2004-526263 | 8/2004 |

(Continued)

OTHER PUBLICATIONS

International Search Report dated Jul. 15, 2008 for International Application No. PCT/JP2008/057881.

*Primary Examiner* — Dung Van Nguyen
(74) *Attorney, Agent, or Firm* — Wenderoth, Lind & Ponack, L.L.P.

(57) ABSTRACT

A polishing apparatus includes a loading section (14) for placing therein a cassette (12) in which a plurality of polishing objects are housed; a first polishing line (20) and a second polishing line (30) for polishing a polishing object; a cleaning line (40) having cleaning machines (42a, 42b, 42c, 42d) for cleaning the polishing object after polishing and a transport unit (44) for transporting the polishing object; a transport mechanism (50) for transporting the polishing object between the loading section (14), the polishing lines (20, 30) and the cleaning line (40); and a control section for controlling the polishing lines (20, 30), the cleaning line (40) and the transport mechanism (50). The control section determines a polishing start time in each of the first and second polishing lines (20, 30) based on a predicted polishing time in each of the first and second polishing lines (20, 30), a predicted transport time in the transport mechanism (50), a predicted cleaning time in the cleaning line (40) and a predicted cleaning start time to start cleaning by driving the transport unit (44) of the cleaning line (40).

33 Claims, 10 Drawing Sheets

| U.S. PATENT DOCUMENTS | | | | |
|---|---|---|---|---|
| 6,535,784 | B2 | 3/2003 | Joma et al. | |
| 6,772,029 | B2 | 8/2004 | Kobayashi et al. | |
| 6,935,930 | B2 * | 8/2005 | Fujita | 451/41 |
| 7,559,823 | B2 * | 7/2009 | Sato et al. | 451/5 |
| 2004/0106364 | A1 | 6/2004 | Nagashima | |

| FOREIGN PATENT DOCUMENTS | | |
|---|---|---|
| JP | 2008-91698 | 4/2008 |
| WO | 01/54187 | 7/2001 |
| WO | 02/088859 | 11/2002 |
| WO | 2006/035337 | 4/2006 |

\* cited by examiner

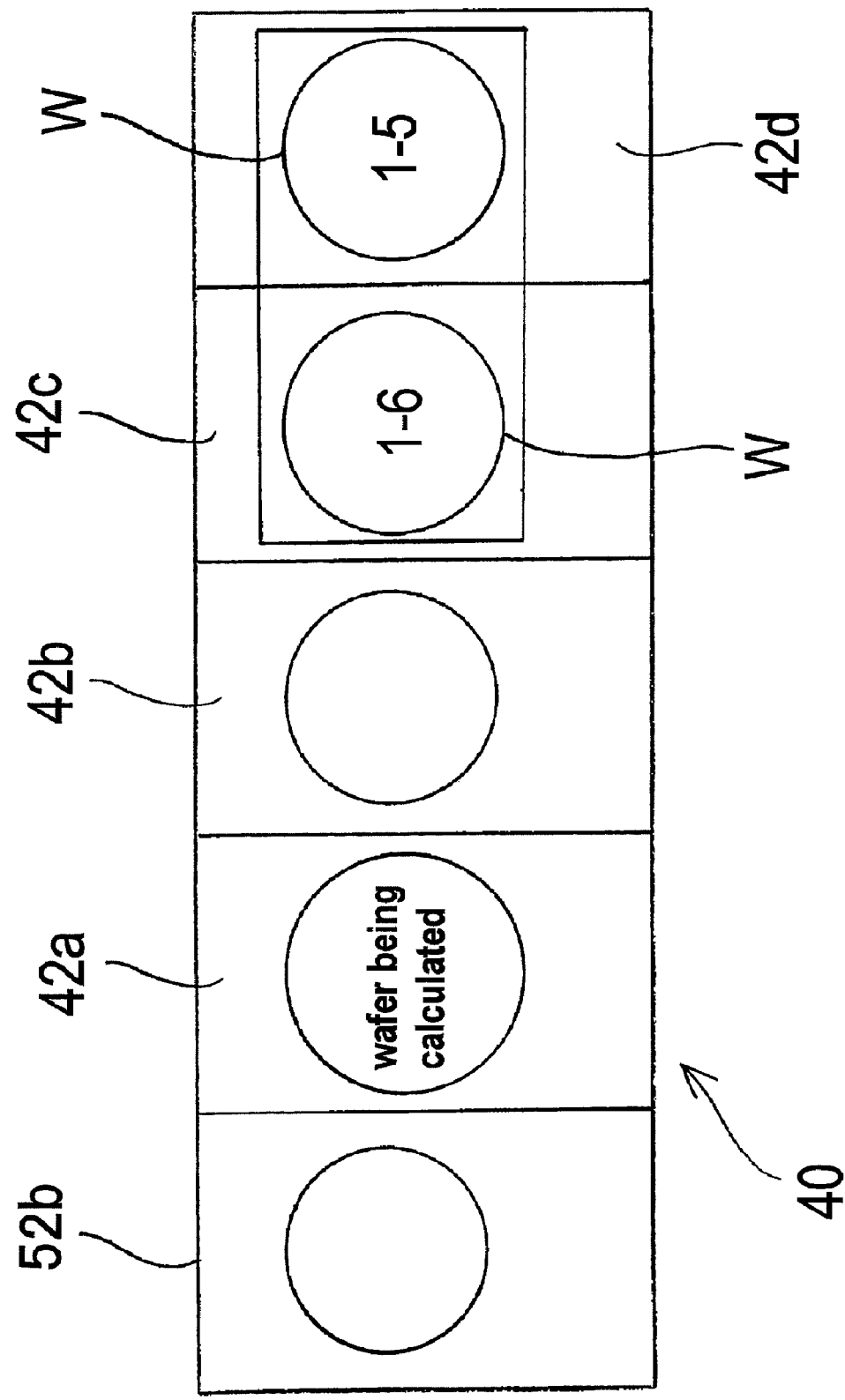

POLISHING APPARATUS AND PROGRAM THEREOF

TECHNICAL FIELD

The present invention relates to a polishing apparatus and a program thereof, and more particularly to a polishing apparatus for polishing a polishing object, such as a semiconductor wafer, into a flat mirror-like surface, and a program stored in a control section of the polishing apparatus.

BACKGROUND ART

A process (so-called damascene process), which involves filling a metal (interconnect material) into interconnect trenches and via holes, is currently being used as a process for the formation of interconnects of a semiconductor device. The process technology involves filling a metal such as aluminum, or more recently copper or silver, into interconnect trenches and via holes previously formed in an interlayer dielectric, and then removing an extra metal by chemical mechanical polishing (CMP) into a flat surface.

FIGS. 1A through 1D illustrate, in a sequence of process steps, an exemplary process for forming copper interconnects in a semiconductor device. First, as shown in FIG. 1A, an insulating film (interlayer dielectric) 2, e.g., an $SiO_2$ oxide film or a film of low-k material, is deposited on a conductive layer 1a, in which semiconductor elements have been formed, on a semiconductor base 1; via holes 3 and interconnect trenches 4 as interconnect recesses are formed in the insulating film 2, e.g., by the lithography/etching technique; and, e.g., by sputtering, a barrier layer 5 of TaN or the like is formed on an entire surface and a seed layer 6, which serves as a feeding layer during electroplating, is formed on the barrier layer 5.

Subsequently, as shown in FIG. 1B, copper plating is carried out on a surface of a wafer (polishing object) W to deposit a copper film 7 on the insulating film 2 while filling copper into the via holes 3 and the interconnect trenches 4 of the wafer W. Thereafter, as shown in FIG. 1C, the seed layer 6 and the copper film 7 on the barrier layer 5 are removed, e.g., by chemical mechanical polishing (CMP) until the surface of the barrier layer 5 becomes exposed and, as shown in FIG. 1D, the barrier layer 5 on the insulating film 2 and, if necessary, a surface portion of the insulating film 2 are removed, thereby forming interconnects (copper interconnects) 8 composed of the seed layer 6 and the copper film 7 in the insulating film 2.

A polishing apparatus which, in order to increase the throughput, is provided with two polishing lines and one cleaning line has been developed. In such a polishing apparatus, wafers (polishing objects) after polishing are sequentially supplied from two polishing lines to one cleaning line. In this case, when a wafer has entered into a cleaning process, another wafer cannot enter into a cleaning process until the termination of the preceding cleaning process. Thus, a situation occurs in which cleaning of a wafer after polishing cannot be started immediately after the polishing, and the wafer must stand-by until a cleaning machine becomes available.

In a metal film polishing process, for example, a copper film polishing process in the above-described process for the formation of copper interconnects, if a wafer after polishing is left as it is in a wet state, corrosion of copper, constituting copper interconnects of a semiconductor circuit in the surface of the wafer, will progress. The corrosion of the copper interconnects leads to an increase in the resistance, and therefore must be avoided as much as possible.

In order to retard progress of corrosion of copper, constituting copper interconnects of a wafer, during the period after the termination of polishing until the start of cleaning, it is a common practice to supply pure water to a surface of the wafer so that the wafer surface after polishing may not be directly exposed to the air. This method, however, cannot fully prevent corrosion of copper. In order to fully prevent corrosion of copper, it is required to minimize the time period from the termination of polishing to the start of cleaning.

Schedulers for controlling the process of transport, processing and cleaning of a wafer in, e.g., a wafer processing apparatus have been proposed (see Published Japanese Translation of International Patent Publication Nos. 2004-526263 and 2002-511193, and International Patent Publication No. 01/054187 Pamphlet).

DISCLOSURE OF INVENTION

Generally, conventional schedulers for controlling the process of transport, processing and cleaning of a wafer are primarily intended to maximize the throughput. Maximizing the throughput, however, can produce a wafer's cleaning wait time between the termination of polishing and the start of cleaning, which will progress corrosion of copper in a copper interconnects-forming process, for example. Such conventional schedulers, therefore, cannot meet the demand for fully preventing corrosion of copper.

The present invention has been made in view of the above situation. It is therefore an object of the present invention to provide a polishing apparatus and a program stored in the control section of the polishing apparatus, which make it possible to minimize the time period from the termination of polishing of a polishing object to the start of cleaning of the polishing object while maintaining the highest possible throughout.

The present invention provides a polishing apparatus comprising: a loading section for placing therein a cassette in which a plurality of polishing objects are housed; a first polishing line and a second polishing line for polishing a polishing object; a cleaning line having a cleaning machine for cleaning the polishing object after polishing and a transport unit for transporting the polishing object; a transport mechanism for transporting the polishing object between the loading section, the polishing lines and the cleaning line; and a control section for controlling the polishing lines, the cleaning line and the transport mechanism. The control section determines a polishing start time in each of the first and second polishing lines based on a predicted polishing time in each of the first and second polishing lines, a predicted transport time in the transport mechanism, a predicted cleaning time in the cleaning line and a predicted cleaning start time to start cleaning by driving the transport unit of the cleaning line.

The present invention provides another polishing apparatus comprising: a loading section for placing therein a cassette in which a plurality of polishing objects are housed; a plurality of polishing lines for polishing a polishing object; a cleaning line having a cleaning machine for cleaning the polishing object after polishing and a transport unit for transporting the polishing object; a transport mechanism for transporting the polishing object between the loading section, the polishing lines and the cleaning line; and a control section for controlling the polishing lines, the cleaning line and the transport mechanism. The control section determines a polishing wait time by subtracting a predicted polishing end time in the case of zero wait time from a predicted cleaning start time in the cleaning line and, when the polishing wait time is positive, delays a polishing start time in each of the polishing lines by the polishing wait time.

The present invention provides yet another polishing apparatus comprising: a loading section for placing therein a cassette in which a plurality of polishing objects are housed; a polishing line having a plurality of polishing sections for polishing a polishing object; a cleaning line having a plurality of cleaning machines for cleaning the polishing object after polishing and a transport unit for transporting the polishing object; a transport mechanism for transporting the polishing object between the loading section, the polishing line and the cleaning line; and a control section for controlling the polishing line, the cleaning line and the transport mechanism. The control section determines a polishing wait time by subtracting a predicted polishing end time in the case of zero wait time from a predicted cleaning start time in the cleaning line and, when the polishing wait time is positive, delays a polishing start time in the polishing line by the polishing wait time.

The present invention also provides a program stored in a control section of a polishing apparatus, which comprises: a loading section for placing therein a cassette in which a plurality of polishing objects are housed; a first polishing line and a second polishing line for polishing a polishing object; a cleaning line having a cleaning machine for cleaning the polishing object after polishing and a transport unit for transporting the polishing object; a transport mechanism for transporting the polishing object between the loading section, the polishing lines and the cleaning line; and the control section for controlling the polishing lines, the cleaning line and the transport mechanism. The program causes a computer to execute a procedure to determine a polishing start time in each of the first and second polishing lines based on a predicted polishing time in each of the first and second polishing lines, a predicted transport time in the transport mechanism, a predicted cleaning time in the cleaning line and a predicted cleaning start time to start cleaning by driving the transport unit of the cleaning line.

The present invention provides another program stored in a control section of a polishing apparatus, which comprises: a loading section for placing therein a cassette in which a plurality of polishing objects are housed; a plurality of polishing lines for polishing a polishing object; a cleaning line having a cleaning machine for cleaning the polishing object after polishing and a transport unit for transporting the polishing object; a transport mechanism for transporting the polishing object between the loading section, the polishing lines and the cleaning line; and the control section for controlling the polishing lines, the cleaning line and the transport mechanism. The program causes a computer to execute a procedure to determine a polishing wait time by subtracting a predicted polishing end time in the case of zero wait time from a predicted cleaning start time in the cleaning line and, when the polishing wait time is positive, delay a polishing start time in each of the polishing lines by the polishing wait time.

The present invention provides yet another program stored in a control section of a polishing apparatus, which comprises: a loading section for placing therein a cassette in which a plurality of polishing objects are housed; a polishing line having a plurality polishing sections for polishing a polishing object; a cleaning line having a plurality of cleaning machines for cleaning the polishing object after polishing and a transport unit for transporting the polishing object; a transport mechanism for transporting the polishing object between the loading section, the polishing line and the cleaning line; and the control section for controlling the polishing line, the cleaning line and the transport mechanism. The program causes a computer to execute a procedure to determine a polishing wait time by subtracting a predicted polishing end time in the case of zero wait time from a predicted cleaning start time in the cleaning line and, when the polishing wait time is positive, delay a polishing start time in the polishing line by the polishing wait time.

The present invention makes it possible to eliminate a cleaning wait time between the termination of polishing and the start of cleaning so that a polishing object can be cleansed immediately after polishing while maintaining the highest possible throughput, i.e., minimizing decrease in the throughput. The present invention, when applied in a process for the formation of copper interconnects, for example, can fully prevent corrosion of copper.

BRIEF DESCRIPTION OF DRAWINGS

FIG. 11B is a diagram showing a wafer map after twice (N=2) shifting the wafer map of FIG. 11A.

BEST MODE FOR CARRYING OUT THE INVENTION

Figure 1A:
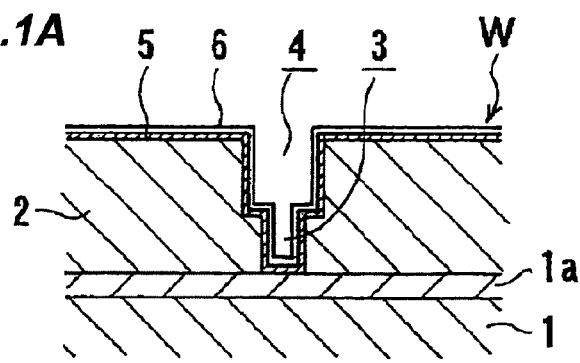
FIGS. 1A through 1D are diagrams illustrating, in a sequence of process steps, a process for the formation of copper interconnects in a semiconductor device.
Figure 1B:
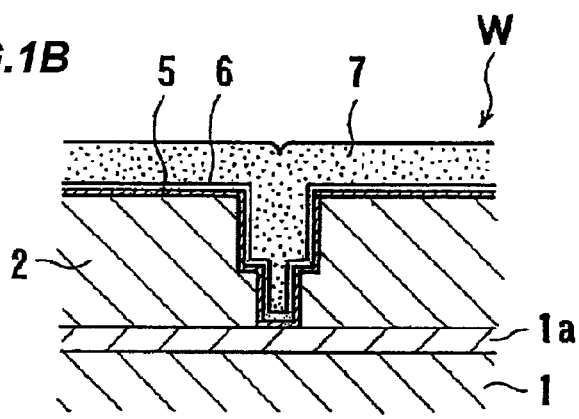
Figure 1C:
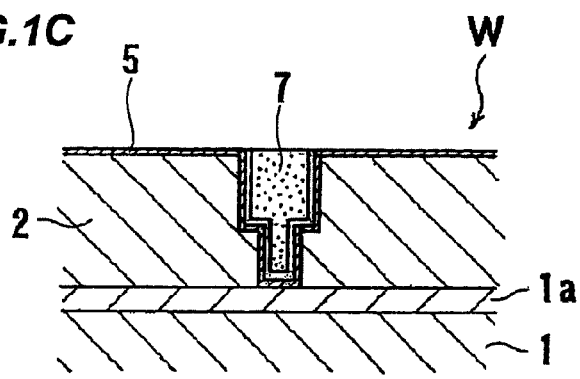
Figure 1D:
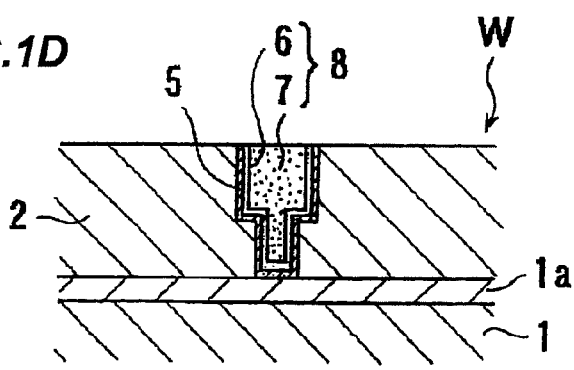

Preferred embodiments of the present invention will now be described in detail with reference to the drawings. The following description illustrates an exemplified case in which a substrate W as shown in FIG. 1B, having a copper film 7 formed in a surface, is prepared and two-step polishing of the substrate W is carried out in the following manner: First, as shown in FIG. 1C, the copper film 7 and a seed layer 6 on a barrier layer 5 are removed by polishing until the surface of the barrier layer 5 becomes exposed (first polishing); and subsequently, as shown in FIG. 1D, the barrier layer 5 on the insulating film 2 and, if necessary, a surface part of the insulating film 2 are removed by polishing (second polishing). Process control of the below-described polishing apparatus is performed in the control section 70 shown in FIG. 2 in the polishing apparatus, and the process control system is stored as a program in the control section.

Figure 2:
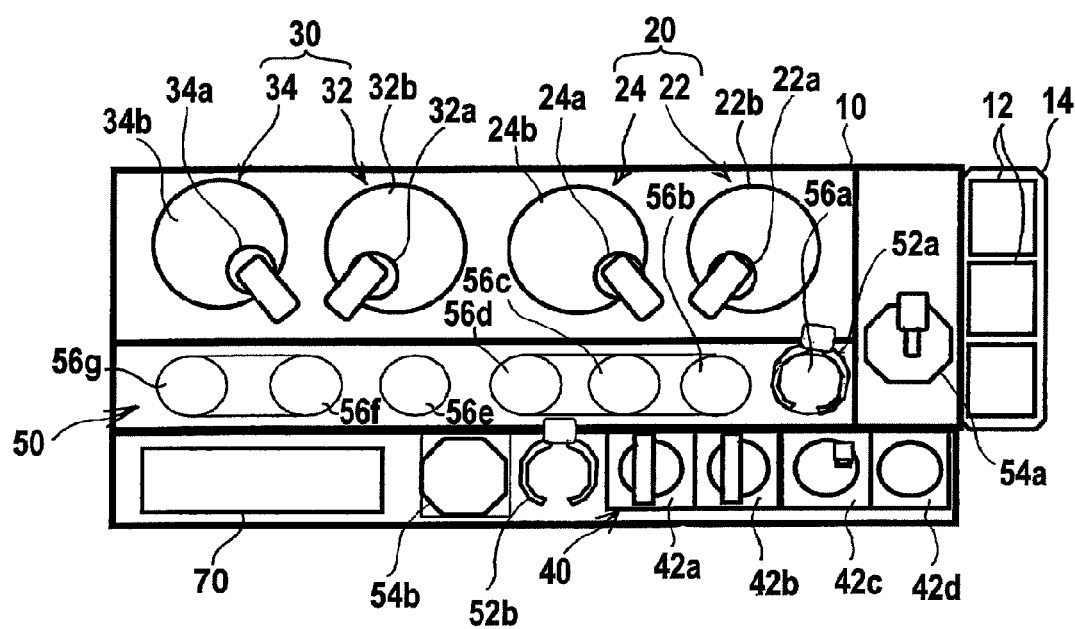
FIG. 2 is an overall plan view schematically showing a polishing apparatus according to an embodiment of the present invention.
Figure 3:
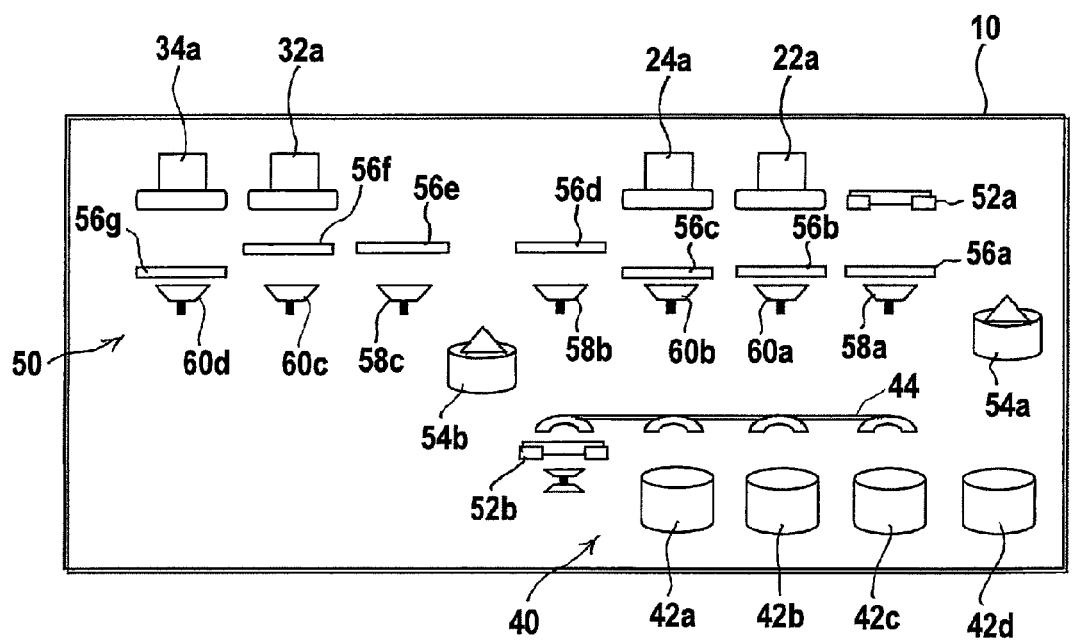
FIG. 3 is a diagram schematically showing the construction of the polishing apparatus shown in FIG. 2.

FIG. 2 is an overall plan view schematically showing a polishing apparatus according to an embodiment of the present invention, and FIG. 3 is a diagram schematically showing the construction of the polishing apparatus shown in FIG. 2. As shown in FIG. 2, the polishing apparatus of this embodiment includes a generally-rectangular housing 10 and a loading section 14 for placing therein a plurality of cassettes 12 (three cassettes in this embodiment) in which a number of semiconductor wafers (polishing objects) are housed. Each cassette 12 is housed in a closed container, such as SMIF (standard manufacturing interface) or FOUP (front opening unified pod).

In the housing 10 are housed a first polishing line 20 having a first polishing section 22 and a second polishing section 24, and a second polishing line 30 having a first polishing section 32 and a second polishing section 34, which lines are located along one long side of the housing 10. The first polishing section 22 of the first polishing line 20 includes a top ring 22a for detachably holding a wafer W, and a polishing table 22b having a polishing surface; and the second polishing section 24 includes a top ring 24a for detachably holding the wafer W, and a polishing table 24b having a polishing surface. Similarly, the first polishing section 32 of the second polishing line 30 includes a top ring 32a and a polishing table 32b; and the second polishing section 34 includes a top ring 34a and a polishing table 34b.

In the housing 10 is also housed a cleaning line 40 located along the other long side of the housing 10. In this embodiment, the cleaning line 40 has four cleaning machines: a first cleaning machine 42a, a second cleaning machine 42b, a third cleaning machine 42c and a fourth cleaning machine 42d, disposed in an in-line arrangement, and a transport unit 44 (see FIG. 3), having the same number of hands as the number of the cleaning machines, which repeats a reciprocating movement. By the repetition of the reciprocating movement of the transport unit 44, wafers are sequentially transported and cleaned as follows: first cleaning machine 42a→second cleaning machine 42b→third cleaning machine 42c→fourth cleaning machine 42d. The cleaning time in a cleaning machine whose cleaning time is the longest of the cleaning machines 42a to 42d is set as a cleaning tact time (cleaning time). The transport unit 44 is driven to transport wafers after the termination of cleaning in the cleaning machine of the longest cleaning time.

A transport mechanism 50 for transporting a wafer between the loading section 14, the polishing lines 20, 30 and the cleaning line 40 is disposed between them. The transport mechanism 50 has a first reversing machine 52a for 180° reversing a wafer before polishing and a second reversing machine 52b for 180° reversing a wafer after polishing. A first transport robot 54a is disposed between the first reversing machine 52a and the loading section 14, and a second transport robot 54b is disposed between the second reversing machine 52b and the cleaning line 40.

A first linear transporter 56a, a second linear transporter 56b, a third linear transporter 56c and a fourth linear transporter 56d are disposed in order of increasing distance from the loading section 14 between the first polishing line 20 and the cleaning line 40. The first reversing machine 52a is disposed above the first linear transporter 56a, and a vertically-movable lifter 58a is disposed below the transporter 56a. A vertically-movable pusher 60a is disposed below the second linear transporter 56b and a vertically-movable pusher 60b is disposed below the third linear transporter 56c. A vertically-movable lifter 58b is disposed below the fourth linear transporter 56d.

Beside the second polishing line 30, a fifth linear transporter 56e, a sixth linear transporter 56f and a seventh linear transporter 56g are disposed in order of increasing distance from the loading section 14. A vertically-movable lifter 58c is disposed below the fifth linear transporter 56e and a vertically-movable pusher 60c is disposed below the sixth linear transporter 56f. A vertically-movable pusher 60d is disposed below the seventh linear transporter 56g.

A process for polishing wafers by the thus-constructed polishing apparatus will now be described.

1st, 3rd . . . nth (n is odd) wafers, taken by the first transport robot 54a from one of the cassettes 12 placed in the loading section 14, are transported in the following path: first reversing machine 52a→first linear transporter 56a→top ring 22a (first polishing section 22 of first polishing line 20)→second linear transporter 56b→top ring 24a (second polishing section 24 of first polishing line 20)→third linear transporter 56c→second transport robot 54b→second reversing machine 52b→cleaning machine 42a, cleaning machine 42b→cleaning machine 42c→cleaning machine 42d→first transport robot 54a, and are returned to the original cassette 12.

2nd, 4th . . . nth (n is even) wafers, taken by the first transport robot 54a from the same cassette 12 placed in the loading section 14, are transported in the following path: first reversing machine 52a→fourth linear transporter 56d→second transport robot 54b→fifth linear transporter 56e→top ring 32a (first polishing section 32 of second polishing line 30)→sixth linear transporter 56f→top ring 34a (second polishing section 34 of second polishing line 30)→seventh linear transporter 56g→second transport robot 54b→second reversing machine 52b→cleaning machine 42a→cleaning machine 42b→cleaning machine 42c→cleaning machine 42d→first transport robot 54a, and are returned to the original cassette 12.

As described above, the copper film 7 and the seed layer 6 on the barrier layer 5 are removed by polishing (first polishing) in the first polishing section 22 of the first polishing line 20 or in the first polishing section 32 of the second polishing line 30; and subsequently the barrier layer 5 on the insulating film 2 and, if necessary, a surface portion of the insulating film 2 are removed by polishing (second polishing) in the second polishing section 24 of the first polishing line 20 or in the second polishing section 34 of the second polishing line 30. The wafers after the second polishing are sequentially cleaned and dried in the cleaning machines 42a to 42d, and then returned to the cassette 12.

In the cleaning line 40, after cleaning the 1st wafer, which has been polished in the first polishing line 20, in the first cleaning machine 42a, the 1st wafer and the 2nd wafer, which has been polished in the second polishing line 30, are simultaneously gripped by the transport unit 44, and the 1st and 2nd wafers are simultaneously transported to the second cleaning machine 42b and the first cleaning machine 42a, respectively, and the two wafers are cleaned simultaneously. After cleaning the 1st and 2nd wafers, the two wafers and the 3rd wafer, which has been polished in the first polishing line 20, are simultaneously gripped by the transport unit 44, and the 1st, 2nd and 3rd wafers are simultaneously transported to the third cleaning machine 42c, the second cleaning machine 42b and the first cleaning machine 42a, respectively, and the three wafers are cleaned simultaneously. By repeating the above operation, it becomes possible to manage the two polishing lines 20, 30 with the use of the single cleaning line 40.

Figure 4:
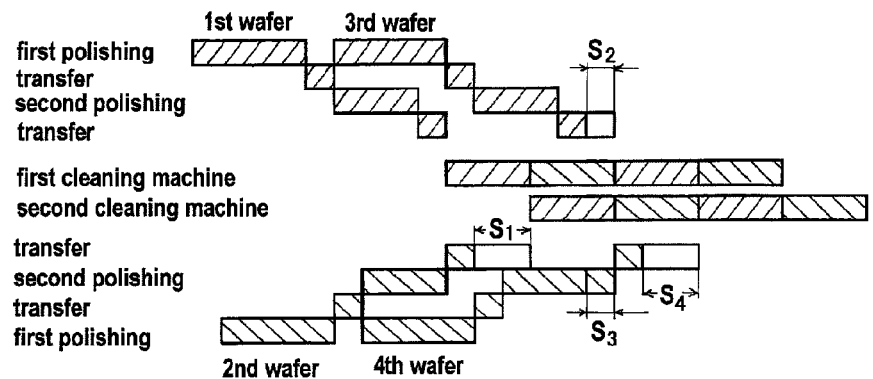
FIG. 4 is a time chart illustrating control of the polishing apparatus shown in FIG. 2 by a control section when the control is performed in such a manner as to maximize the throughput.

In this case, when the polishing apparatus is controlled by the control section such as to maximize the throughput, as shown in the time chart of FIG. 4, a cleaning wait time $S_1$ until the start of cleaning in the first cleaning machine 42a of the 2nd wafer after polishing is produced. A cleaning wait time $S_2$ until the start of cleaning in the first cleaning machine 42a of the 3rd wafer after polishing is produced. Further, with reference to the 4th wafer after polishing, a cleaning wait time $S_3$, $S_4$ until the start of cleaning in the first cleaning machine 42a is produced. Such a cleaning wait time until the start of cleaning after the termination of polishing, raises concern for corrosion of copper in, e.g., a copper interconnects-forming process.

In this embodiment, an nth (n is odd) wafer taken out of the cassette 12 is polished in the first polishing line 20, while an nth (n is even) wafer taken out of the same cassette 12 is polished in the second polishing line 30 in an alternate manner. However, it is also possible to polish an nth (n is odd) wafer taken out of the cassette 12 in the second polishing line 30, and polish an nth (n is even) wafer taken out of the same cassette 12 in the first polishing line 20 in an alternate manner. Further, it is possible to polish wafers, taken out of different cassettes alternately, in the first polishing line 20 and in the second polishing line 30 alternately, and to return the wafers after polishing to the original cassettes.

In the present invention, the polishing apparatus is controlled by the control section in the following manner so that wafers can be cleaned immediately or within the shortest possible time after polishing, without a cleaning wait time, while maintaining the highest possible throughput. The following description illustrates a case in which an nth (n is odd) wafer and an nth (n is even) wafer, both taken out of the same cassette 12, are polished respectively in the first polishing line 20 and in the second polishing line 30 in an alternate manner.

A description will be first made of a first mode which eliminates the polishing wait times $S_1$ to $S_4$ in the time chart shown in FIG. 4 so that the 1st to 4th wafers can enter into cleaning process immediately after the termination of polishing. In this first mode, (1) polishing time in the first polishing sections 22, 32, (2) polishing time in the second polishing sections 24, 34, (3) transport time from the first polishing section 22 or 32 to the second polishing section 24 or 34, and (4) cleaning start time are respectively predicted before starting polishing in the first polishing section 22 of the first polishing line 20 (or in the first polishing section 32 of the second polishing line 30). Based on the predicted values, the difference between the predicted cleaning start time and the predicted polishing end time in the first polishing line 20 and the second polishing line 30 is calculated and, taking the difference as a polishing wait time, polishing start time in the first polishing section 22 of the first polishing line 20 and/or in the first polishing section 32 of the second polishing line 30 is delayed by the polishing wait time. This will be explained in more detail below.

(1) Timing of Performing Predictive Calculations

Predictive calculations are performed before starting a polishing process. In particular, the calculations are performed at the start or after the termination of transport of a wafer from the first linear transporter 56a to the first polishing section 22 of the first polishing line 20. In the case where polishing is started from the second polishing line 30, the calculations are performed at the start or after the termination of transport of a wafer from the fifth linear transporter 56e to the first polishing section 32 of the second polishing line 30.

(2) Items of Predictive Formulae $T_1$: Predicted Polishing Time in First Polishing Section Polishing time in the first polishing section 22 of the first polishing line 20 is predicted, and taken as predicted polishing time $T_1$ in the first polishing section. In this embodiment, predicted polishing time in the first polishing section 32 of the second polishing line 30 is also $T_1$. The predicted polishing time $T_1$ may be determined, for example, by calculation based on recipe data or by averaging past polishing time data on polishing carried out by the same recipe. Polishing in the first polishing section 22 or 32 (first polishing) is generally carried out while detecting the end point of polishing. Polishing time is likely to vary among wafers when polishing is carried out in such a manner. It is therefore preferred to use the average polishing time as the predicted polishing time $T_1$.

$T_2$: Predicted Polishing Time in Second Polishing Section

Polishing time in the second polishing section 24 of the first polishing line 20 is predicted, and taken as predicted polishing time $T_2$ in the second polishing section. In this embodiment, predicted polishing time in the second polishing section 34 of the second polishing line 30 is also $T_2$. The predicted polishing time $T_2$ may be determined, for example, by calculation based on recipe data or by averaging past polishing time data on polishing carried out by the same recipe.

$T_3$: Predicted Wafer Transport Time in Polishing Line

Time taken for transporting a wafer from the first polishing section 22 to the second polishing section 24 in the first polishing line 20 is predicted, and taken as predicted transport time $T_3$ in polishing line. In this embodiment, predicted transport time in the second polishing line 30 is also $T_3$.

The total sum of the predicted polishing time $T_1$ in first polishing section, the predicted polishing time $T_2$ in second polishing section and the predicted transport time $T_3$ in polishing line, $T_1+T_2+T_3$, amounts to predicted polishing time in the first polishing line 20. In this embodiment, predicted polishing time in the second polishing line 30 is equal to the predicted polishing time in the first polishing line 20.

$T_4$: Predicted Transport Time in Transport Mechanism

Time taken for transporting a wafer after polishing in the first polishing line 20 (first polishing in the first polishing section 22 and second polishing in the second polishing section 24) to the cleaning line 40 via the second reversing machine 52b is predicted, and taken as predicted transport time $T_4$ in the transport mechanism.

$F_n$: Predicted Cleaning Start Time for nth Wafer

Time as determined by adding predicted cleaning time $T_5$ in the cleaning line 40 to predicted cleaning start time $F_{n-1}$ for an (n−1)th wafer is taken as predicted cleaning start time $F_n$ for an nth wafer. The predicted cleaning start time $F_{n-1}$ for an (n−1)th wafer is a predicted time at which a cleaning process is started for the wafer just preceding the nth wafer as a calculation object, in particular, a predicted time at which the transport unit 44 of the cleaning line 40 is driven to carry the (n−1)th wafer into the first cleaning machine 42a of the cleaning line 40 for cleaning the (n−1)th wafer.

The predicted polishing time $T_1+T_2+T_3$ in the first polishing line 20, the predicted transport time $T_4$ in the transport mechanism 50 and the predicted cleaning time $T_5$ in the cleaning line 40 are set in advance of actually carrying out polishing of a 1st wafer. Predicted cleaning start time $F_1$ for the 1st wafer can therefore be calculated as a predicted value. Assuming that there is no delay in polishing processes in the polishing sections, predicted cleaning start time $F_2$ for the 2nd wafer can be calculated by adding the predicted cleaning time $T_5$ to the predicted cleaning start time $F_1$ for the 1st wafer ($F_2=F_1+T_5$). In this manner, for the 2nd, 3rd, 4th . . . wafers, their cleaning process start times can be calculated one after another as predicted values by recurrence formulae. Thus, "predicted time" is determined for the 2nd, 3rd . . . wafers because their cleaning is not actually started as yet.

The predicted cleaning time $T_5$ is also called cleaning tact time. In the polishing apparatus of this embodiment, the transport unit 44 simultaneously transports a plurality of wafers, and therefore the cleaning tact time $T_5$ corresponds to the cleaning time in a cleaning machine whose cleaning time is the longest of the cleaning machines 42a to 42d. The cleaning tact time $T_5$ may be determined, for example, by calculation based on recipe data or by averaging past cleaning time data on cleaning carried out by the same recipe. The cleaning tact time includes time taken for operating a cylinder for vertically moving, e.g., a cleaning pen or brush. Such an operation can be modified mechanically, e.g., by means of a speed control mechanism. Accordingly, the past average cleaning time can be used, e.g., depending on the user demand.

The predicted cleaning start time $F_n$ and the cleaning tact time (predicted cleaning time) $T_5$ are common to the first polishing line 20 and the second polishing line 30. The above-described definitions for the predicted times $T_1$ to $T_4$, $T_5$ and the predicted time $F_n$ also hold for the below-described embodiments.

(3) Predictive Formulae

When polishing wait time is A, the polishing wait time A is determined by performing calculation of the following predictive formulae:

$$A = F_n - (\text{current time} + T_1 + T_2 + T_3 + T_4)$$

$$F_n = F_{n-1} + T_5$$

When A>0, i.e., predicted cleaning start time $F_n$ for an nth wafer>(current time+$T_1$+$T_2$+$T_3$+$T_4$), the value of A is polishing wait time, and polishing start time is delayed by the polishing wait time A.

When A=0, i.e., predicted cleaning start time $F_n$ for an nth wafer=(current time+$T_1$+$T_2$+$T_3$+$T_4$), there is no polishing wait time.

When A<0, i.e., predicted cleaning start time $F_n$ for an nth wafer<(current time+$T_1$+$T_2$+$T_3$+$T_4$), a polishing wait time is produced and the wafer must wait for cleaning process. In this embodiment, the transport unit 44 of the cleaning line 40 simultaneously transports a plurality of wafers, and therefore the time at which the transport unit 44 of the cleaning line 40 is driven is delayed by the absolute value of the polishing wait time A.

Arithmetic processing in the control section will now be described more specifically. Assume that the predicted polishing time $T_1$ in first polishing section is 120, the predicted polishing time $T_2$ in second polishing section is 90, the predicted wafer transport time $T_3$ in polishing line is 30, the predicted transport time $T_4$ in transport mechanism is 30, and the cleaning tact time $T_5$ is 90. The values may be either seconds or relative values. In the case where the first polishing line 20 and the second polishing line 30 polish wafers from different cassettes, it is possible that the predicted polishing times in the two polishing lines may be different. In this case, a longer predicted polishing time is adopted.

When the 1st wafer (wafer ID: F1W01) has reached the first polishing line 20 at current time 100, the control section, before starting polishing of the 1st wafer in the first polishing section 22 of the first polishing line 20, calculates a predicted cleaning start time for the 1st wafer as follows: 100 (current time)+120 ($T_1$)+90 ($T_2$)+30 ($T_3$)+30 ($T_4$)=370.

As shown in the following Table 2, the predicted cleaning start time for the 1st wafer (wafer ID: F1W01) is set in the blanks shown in the following Table 1. In this case, the first polishing wait time is 0.

TABLE 1

| Wafer ID | Predicted cleaning start time | First polishing wait time |
| --- | --- | --- |
|  |  |  |

TABLE 2

| Wafer ID | Predicted cleaning start time | First polishing wait time |
| --- | --- | --- |
| F1W01 | 370 | 0 |

Next, when the 2nd wafer (wafer ID: F2W01) has reached the second polishing line 30 of the polishing apparatus at time 130, the arithmetic section performs the same calculation as for the 1st wafer, except for using the current time 130, and calculates predicted polishing end time 400 [=130+120 ($T_1$)+90 ($T_2$)+30 ($T_3$)+30 ($T_4$)] in the case of no wait time. On the other hand, the arithmetic section, by adding the cleaning tact time 90 to the predicted cleaning start time $F_1$ for the 1st wafer, which is 370, calculates predicted cleaning start time $F_2$ for the 2nd wafer: $F_2$=460 (=370+90), at which driving of the transport unit 44 of the cleaning line 40 is started. Next, the difference 60 between the predicted cleaning start time 460 and the predicted polishing end time 400 is calculated, and the value is taken as the first polishing wait time for the 2nd wafer (wafer ID: F2W01) as shown in Table 3.

TABLE 3

| Wafer ID | Predicted cleaning start time | First polishing wait time |
| --- | --- | --- |
| F1W01 | 370 | 0 |
| F2W01 | 460 | 60 |

The control section sends a command to the top ring 34a of the first polishing section 32 of the second polishing line 30 to start polishing (first polishing) after standing by for a period of 60 so that the 2nd wafer after polishing will be transported to the cleaning line 40 immediately before the start of driving of the transport unit 44 of the cleaning line 40. Thus, when polishing in the second polishing line 30 is started immediately after the start of polishing in the first polishing line 20, the predicted cleaning start time for the 1st wafer is set after the 1st wafer has reached the first linear transporter 52a. Thereafter, the calculation of the polishing wait time is performed for the 2nd wafer which has arrived at the five linear transporter 56e of the second polishing line 30, and the start of polishing in the first polishing section 32 is delayed (waited for) by the polishing wait time. This allows the wafer to stand by in a dry state before the start of polishing process.

When the 3rd wafer (wafer ID: F1W02) has reached the first polishing line 20 of the polishing apparatus at time 250, the arithmetic section performs the same calculation as for the 1st wafer, except for using the current time 250, and calculates predicted polishing end time 520 [=250+120 ($T_1$)+90 ($T_2$)+30 ($T_3$)+30 ($T_4$)] in the case of zero wait time. On the other hand, the arithmetic section, by adding the cleaning tact time 90 to the predicted cleaning start time $F_2$ for the 2nd wafer, which is 460, calculates predicted cleaning start time $F_3$ for the 3rd wafer: $F_3$=550 (=460+90), at which driving of the transport unit 44 of the cleaning line 40 is started. Next, the difference 30 between the predicted cleaning start time 550 and the predicted polishing end time 520 is calculated, and the value is taken as the first polishing wait time for the 3rd wafer (wafer ID: F1W02) as shown in Table 4.

TABLE 4

| Wafer ID | Predicted cleaning start time | First polishing wait time |
| --- | --- | --- |
| F1W01 | 370 | 0 |
| F2W01 | 460 | 60 |
| F1W02 | 550 | 30 |

The control section sends a command to the top ring 24a of the first polishing section 22 of the first polishing line 20 to start polishing (first polishing) after standing by for a period of 30 so that the 3rd wafer after polishing will be transported to the cleaning line 40 immediately before the start of driving of the transport unit 44 of the cleaning line 40.

When the 4th wafer (wafer ID: F2W02) has reached the second polishing line 30 of the polishing apparatus at time 340, the arithmetic section performs the same calculation as for the 1st wafer, except for using the current time 340, and calculates predicted polishing end time 610 in the case of zero wait time. On the other hand, the arithmetic section, by adding the cleaning tact time 90 to the predicted cleaning start time $F_3$ for the 3rd wafer, which is 550, calculates predicted cleaning start time $F_4$=640 for the 4th wafer, at which driving of the transport unit 44 of the cleaning line 40 is started. Next, the difference 30 between the predicted cleaning start time 640 and the predicted polishing end time 610 is calculated, and the value is taken as the first polishing wait time for the 4th wafer (wafer ID: F2W02) as shown in Table 5.

TABLE 5

| Wafer ID | Predicted cleaning start time | First polishing wait time |
| --- | --- | --- |
| F1W01 | 370 | 0 |
| F2W01 | 460 | 60 |
| F1W02 | 550 | 30 |
| F2W02 | 640 | 30 |

The control section sends a command to the top ring 34a of the first polishing section 32 of the second polishing line 30 to start polishing (first polishing) after standing by for a period of 30 so that the 4th wafer after polishing will be transported to the cleaning line 40 immediately before the start of driving of the transport unit 44 of the cleaning line 40. The same calculation is performed for subsequent wafers.

Figure 5:
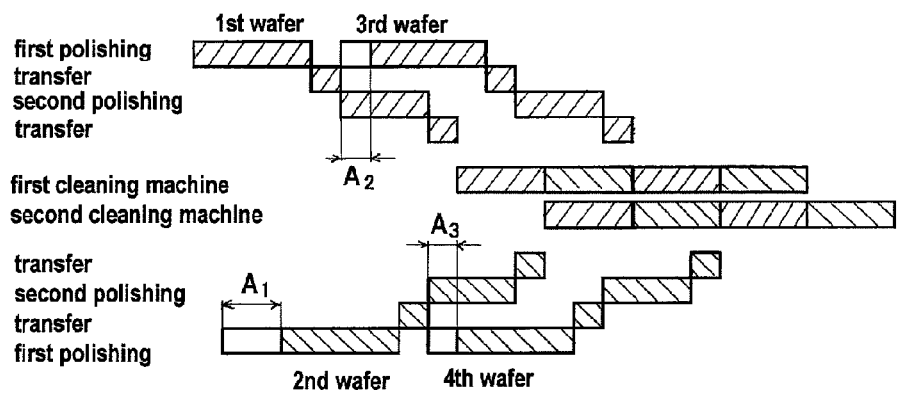
FIG. 5 is a time chart illustrating a first control mode for the polishing apparatus shown in FIG. 2.

FIG. 5 is a time chart illustrating the above-described first mode. As shown by the time chart of FIG. 5, polishing (first polishing) of the 2nd wafer (wafer ID: F2W01) in the first polishing section 32 of the second polishing line 30 is started after the polishing wait time $A_1$ (=60); polishing (first polishing) of the 3rd wafer (wafer ID: F1W02) in the first polishing section 22 of the first polishing line 20 is started after the polishing wait time $A_2$ (=30); and polishing (first polishing) of the 4th wafer (wafer ID: F2W02) in the first polishing section 32 of the second polishing line 30 is started after the polishing wait time $A_3$ (=30). By thus changing conventional cleaning wait time, produced after the termination of polishing and before the start of cleaning, into polishing wait time before the start of polishing, a cleaning wait time can be prevented from being produced after polishing and before cleaning.

Figure 6:
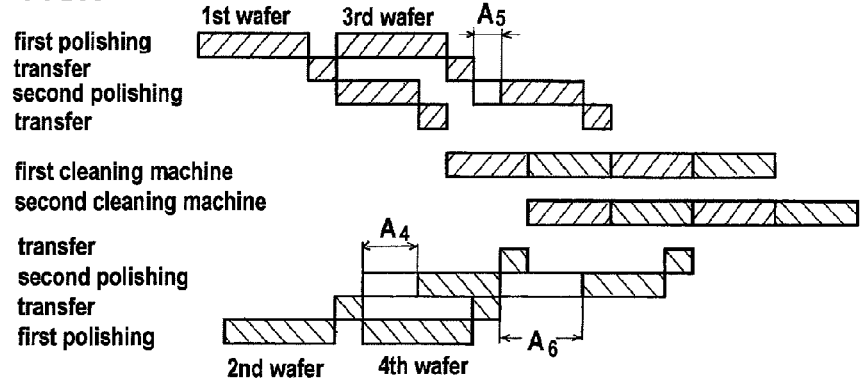
FIG. 6 is a time chart illustrating a second control mode for the polishing apparatus shown in FIG. 2.

Though in the above-described first mode, polishing wait time before polishing in the first polishing sections 22, 32 is calculated and polishing wait time before polishing in the second polishing sections 24, 34 is not calculated, it is also possible to calculate polishing wait time before polishing in the second polishing sections 24, 34 without calculating polishing wait time before polishing in the first polishing sections 22, 32, and to delay only the start of polishing (second polishing) in the second polishing sections 24, 34 (second mode). FIG. 6 shows a time chart illustrating the second mode. The second mode employs predictive formulae which are based on the same idea as the first mode. However, the calculation of polishing wait time is performed before starting operation in the second linear transporter 56b or the second polishing section 24 of the first polishing line 20, or in the fifth linear transporter 56e or the second polishing section 34 of the second polishing line 30, and therefore $T_1$ and $T_3$ in the above-described predictive formulae are unnecessary.

In the second mode, as shown by the time chart of FIG. 6, polishing of the 2nd wafer in the second polishing section 34 of the second polishing line 30 is started after polishing wait time $A_4$ (=60); polishing (second polishing) of the 3rd wafer in the second polishing section 24 of the first polishing line 20 is started after polishing wait time $A_5$ (=30); and polishing (second polishing) of the 4th wafer in the second polishing section 34 of the second polishing line 30 is started after polishing wait time $A_6$ (=90). By thus changing conventional cleaning wait time, produced after the termination of polishing and before the start of cleaning, into polishing wait time before the start of polishing in the second polishing section 24 or 34, a cleaning wait time can be prevented from being produced after polishing and before cleaning.

A description will now be made of a third mode in which the calculation of polishing wait time is performed before polishing (first polishing) in the first polishing sections 22, 32, and the calculation of polishing wait time is performed also before polishing (second polishing) in the second polishing sections 24, 34, and the second polishing is also delayed.

As described above, in a process for the formation of copper interconnects, the copper film 7 is polished (first polishing) in the first polishing section 22 or 32 until the underlying barrier layer 5 becomes exposed. Thereafter, the barrier layer and, if necessary, the underlying insulating film 2 are polished (second polishing) in the second polishing section 24 or 34. A thickness of the copper film to be polished in the first polishing is larger than a thickness of the layer (s) to be polished in the second polishing. Further, polishing operation in the first polishing is generally terminated by detecting the end point, e.g., with an eddy current sensor or an optical sensor. That is, polishing operation in the first polishing is not carried out in a time-controlled manner. Accordingly, polishing time can vary considerably among wafers in the first polishing.

In the case where an average value is employed as predicted polishing time $T_1$ in the first polishing section and the above-described first control mode is used, when the actual polishing time $t_1$ for a wafer in the first polishing section is longer than the predicted polishing time $T_1$ ($t_1 > T_1$), the start of operation in the second polishing or the transport mechanism becomes earlier (advanced) by the time difference. On the other hand, the cleaning line is under the restriction of cleaning time for cleaning. Accordingly, the wafer after the second polishing should stand by for the advance period until the start of driving of the transport unit of the cleaning line. The time period progresses corrosion of copper. In order to solve such problems, the control section performs calculations to compensate for an error between the predicted polishing time $T_1$ and the actual polishing time $t_1$ in the first polishing, i.e., variation in the polishing time, before the second polishing.

Figure 7:
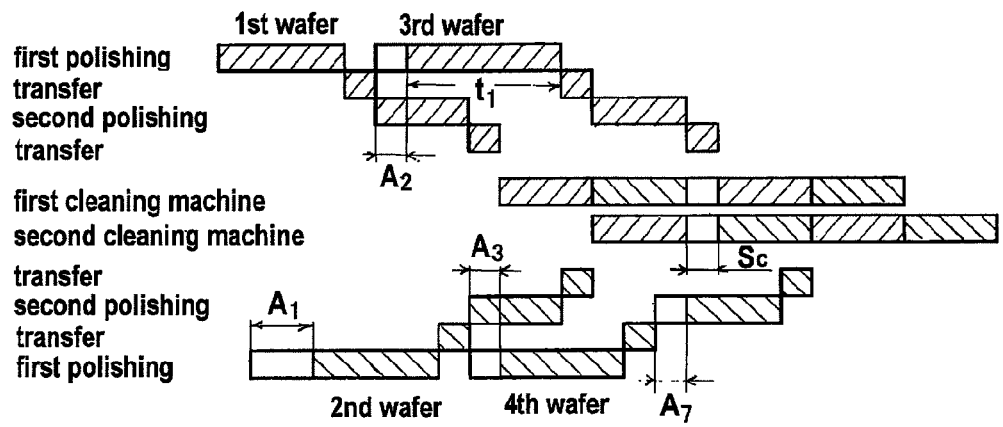
FIG. 7 is a time chart illustrating a third control mode for the polishing apparatus shown in FIG. 2.

FIG. 7 shows a time chart illustrating the third mode. In this mode, the predicted cleaning start time $F_4$ for the 4th wafer calculated before the second polishing is replaced with predicted cleaning start time for the wafer. Further, the delay of the polishing needs to be reflected in subsequent wafers. This is because predicted cleaning start time $F_n$ for an nth wafer has already been calculated by recurrence formulae when the first wafer is subjected to polishing, and an average value is employed as predicted polishing time $T_1$ in the first polishing. Therefore, in order to correct the predicted cleaning start time $F_n$ for an nth wafer, the control section performs arithmetic processing to reflect the delay of the first polishing in subsequent wafers by recurrence formulae. If the predicted cleaning end time for a wafer is later than the predicted cleaning start time for the next wafer, the predicted cleaning start time is delayed for the next wafer while skipping the former wafer.

The third mode will now be described more specifically. Assume that the actual polishing time $t_1$ for the 3rd wafer in the first polishing section 22 of the first polishing line 20 is longer by 30 than the predicted polishing time $T_1$, as shown in FIG. 7. As shown in Table 6, polishing of the 2nd wafer (F2W01) in the second polishing section 34 of the second polishing line 30 and transport of the wafer after polishing are carried out as scheduled and as in the preceding embodiment shown in Table 3.

TABLE 6

| Wafer ID | Predicted cleaning start time | First polishing wait time | Second polishing wait time |
|---|---|---|---|
| F1W01 | 370 | 0 | 0 |
| F2W01 | 460 | 60 | |
| F1W02 | 550 | 30 | |

As shown in Table 7, the predicted cleaning start time $F_3$ for the 3rd wafer (F1W02) is set at 550 and the predicted cleaning start time $F_4$ for the 4th wafer (F2W02) is set at 640 as in the preceding embodiment shown in Table 5.

TABLE 7

| Wafer ID | Predicted cleaning start time | First polishing wait time | Second polishing wait time |
|---|---|---|---|
| F1W01 | 370 | 0 | 0 |
| F2W01 | 460 | 60 | 0 |
| F1W02 | 550 | 30 | |
| F2W02 | 640 | 30 | |

The transport unit 44 of the cleaning line 40, because of the 3rd wafer not having arrived there at the scheduled time 550, the predicted cleaning start time $F_3$, stands by until the arrival of the wafer. Thus, the predicted cleaning start time $F_3$ for the 3rd wafer becomes as follows: $F_2+90 (T_5)+30 (t_1-T_1)=580$. The predicted cleaning start time 580 is later than the initial predicted cleaning start 550 shown in Table 7. Accordingly, as shown in Table 8, the predicted cleaning start time $F_3$ for the 3rd wafer is changed to 580. By thus changing the predicted cleaning start time $F_3$ for the 3rd wafer to 580, it becomes impossible to start cleaning of the 4th wafer at the predicted cleaning start time $F_4$ 640; and the predicted cleaning start time $F_4$ is changed to 670 (=580+90).

TABLE 8

| Wafer ID | Predicted cleaning start time | First polishing wait time | Second polishing wait time |
|---|---|---|---|
| F1W01 | 370 | 0 | 0 |
| F2W01 | 460 | 60 | 0 |
| F1W02 | 580 | 30 | 0 |
| F2W02 | 670 | 30 | |

The transport unit of the cleaning unit actually starts to drive at 580 with a delay of 30. The control section therefore makes the delay 30 reflected in polishing wait time before the second polishing for subsequent wafers, as shown in Table 9. In particular, the predicted polishing end time for the 4th wafer (F2W02) in the case of zero wait time is: 520 (current time)+90 $(T_1)$+30 $(t_1-T_1)$=640, and is thus earlier than the predicted cleaning start time $F_4$ 670 for the 4th wafer. Therefore, the difference 30 between the predicted cleaning start time 670 and the predicted polishing end time 640 is set as the second polishing wait time, while the predicted cleaning start time 670 for the 4th wafer (wafer ID: F2W02) is maintained.

TABLE 9

| Wafer ID | Predicted cleaning start time | First polishing wait time | Second polishing wait time |
|---|---|---|---|
| F1W01 | 370 | 0 | 0 |
| F2W01 | 460 | 60 | 0 |
| F1W02 | 580 | 30 | 0 |
| F2W02 | 670 | 30 | 30 |

As described above and as shown in the time chart of Table 7, a cleaning wait time $S_c$ is produced after the termination of cleaning of the 2nd wafer and before the start of cleaning of the 3rd wafer, and polishing (second polishing) of the 4th wafer (wafer ID: F2W02) in the second polishing section 34 of the second polishing line 30 is started after the second polishing wait time $A_7$ (=30).

A description will now be made of a fourth mode in which predicted cleaning start time is corrected for every wafer transport (cleaning) operation in the cleaning line 40 in order to prevent accumulation of errors on predicted cleaning start time.

In the third mode, variation in the polishing time of the first polishing sections is compensated before the second polishing. This mode, however, cannot compensate for variation in the polishing time of the second polishing. The second polishing may be carried out in a time-controlled manner or in an end point detection-controlled manner using an end point detection sensor. In the latter case, the second polishing time can vary among wafers as in the first polishing. The fourth mode compensates for variation in the polishing time of a wafer in the second polishing by reflecting the variation in predicted cleaning start times for subsequent wafers.

Figure 8:
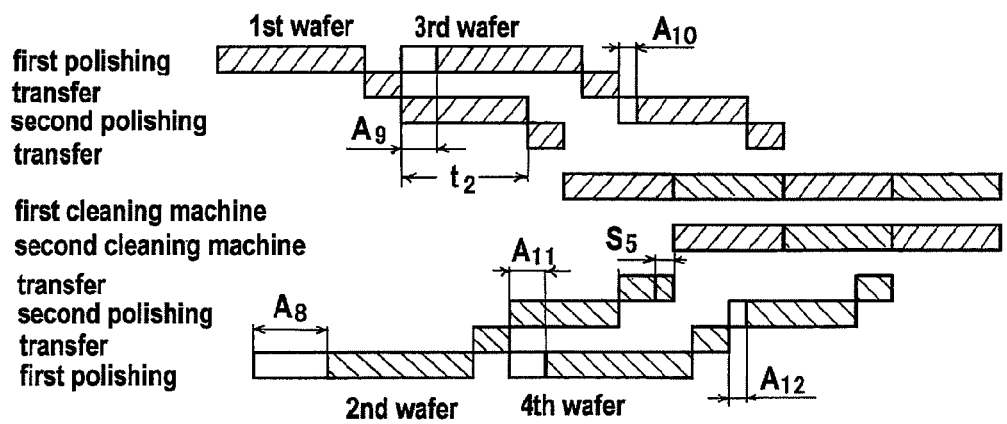
FIG. 8 is a time chart illustrating a fourth control mode for the polishing apparatus shown in FIG. 2.

FIG. 8 shows a time chart illustrating the fourth mode. In the time chart shown in FIG. 8, the actual polishing time $t_2$ for the 1st wafer in the second polishing section 24 is longer than the predicted polishing time $T_2$ in the second polishing section $(t_2 > T_2)$. In this case, since polishing of the 2nd wafer in the second polishing section has already started, the delay time in the polishing of the 1st wafer, i.e., the difference between the actual polishing time and the predicted polishing time in the second polishing section $(t_2-T_2)$, is cleaning wait time for the 2nd wafer. For the 3rd and subsequent wafers, on the other hand, the polishing delay time of the 1st wafer is reflected as polishing wait time for the second polishing in recurrence formulae. This mode can significantly shorten cleaning wait time until the start of cleaning after polishing even when an average value is employed as the predicted polishing time $T_2$ in the second polishing section.

More specifically, referring to FIG. 8, when the 1st wafer has entered the second polishing section 24 of the first polishing line 20, the 2nd wafer (wafer ID: F1W02) is carried into the first polishing section 32 of the second polishing line 30. At that point in time, as shown in Table 10, predicted cleaning start time $F_n$ for an nth wafer has been calculated before the first polishing. The table 10 is the same as the above-described Table 5.

TABLE 10

| Wafer ID | Predicted cleaning start time | First polishing wait time | Second polishing wait time |
|---|---|---|---|
| F1W01 | 370 | 0 | 0 |
| F2W01 | 460 | 60 | 0 |
| F1W02 | 550 | 30 | |
| F2W02 | 640 | 30 | |

Assume that the actual polishing time $t_2$ for the 1st wafer in the second polishing section is longer by 15 than the predicted polishing time $T_2$. The transport unit 44 of the cleaning line 40, because of absence of the 1st wafer in the cleaning line 40 at the predicted cleaning start time, stands by until the arrival of the wafer whereby cleaning wait time is produced. Thus, the predicted cleaning start time $F_1$ for the 1st wafer becomes: 370+15=385. The predicted cleaning start time $F_2$ for the 2nd wafer becomes: 385 ($F_1$)+90 (cleaning time)=475 (>460). In this manner, the predicted cleaning start time $F_n$ for an nth wafer is updated in sequence, as shown in Table 11.

TABLE 11

| Wafer ID | Predicted cleaning start time | First polishing wait time | Second polishing wait time |
|---|---|---|---|
| F1W01 | 385 | 0 | 0 |
| F2W01 | 475 | 60 | 0 |
| F1W02 | 565 | 30 | |
| F2W02 | 655 | 30 | |

Further, the control section performs the following calculations to compensate for the polishing delay time ($t_2-T_2=15$) in the second polishing section: For the 3rd and subsequent wafers, the delay time produced in polishing of the 1st wafer in the second polishing section, i.e., the difference 15 between the actual polishing time $t_2$ and the predicted polishing time $T_2$ in the second polishing section ($t_2-T_2$), is added as polishing wait time for the second polishing section to recurrence formulae. The arithmetic processing can avoid the production of cleaning wait time for the 3rd and subsequent wafers. In particular, when the second polishing start time for 3rd wafer is 430, the predicted polishing end time for the 3rd wafer in the case of no wafer wait time is: 430 (current time)+90 (predicted polishing time $T_2$)+30 (predicted transport time $T_4$ in the transport mechanism)=550. On the other hand, the predicted cleaning start time $F_3$ for the 3rd wafer is 565 as shown in Table 11. The difference 15 between the predicted cleaning start time 565 and the predicted polishing end time 550 is set as the second polishing wait time of the 3rd wafer (wafer ID: F1W02) for polishing in the second polishing section.

TABLE 12

| Wafer ID | Predicted cleaning start time | First polishing wait time | Second polishing wait time |
|---|---|---|---|
| F1W01 | 385 | 0 | 0 |
| F2W01 | 475 | 60 | 0 |
| F1W02 | 565 | 30 | 15 |
| F2W02 | 655 | 30 | |

Thus, as shown by the time chart in FIG. 8, while no wait time is produced for the 1st wafer, first polishing wait time $A_8$ and cleaning wait time $S_5$ are produced for the 2nd wafer, first polishing wait time $A_9$ and second polishing wait time $A_{10}$ are produced for the 3rd wafer, and first polishing wait time $A_{11}$ and second polishing wait time $A_{12}$ are produced for the 4th wafer.

When a delay from a predicted polishing time has occurred in the actual polishing (second polishing) in one polishing line, it is not possible to set a polishing wait time for a wafer which is in second polishing in the other polishing line. Therefore, a cleaning wait time, such as $S_5$ shown in the time chart of FIG. 8, is produced. In this case, the control section may mark the wafer so that the wafer, after cleaning and drying, will be transported to, e.g., an in-line film thickness inspection device, provided in the vicinity of a wafer cassette, for observation of the surface state of the wafer. An in-line film thickness inspection device, because of its high inspection accuracy, generally needs a long inspection time. Therefore, inspection of wafers by such a device is often carried out for arbitrary wafers in a sampling inspection manner. By selecting wafers that need surface inspection and marking the wafers in the above-described manner by the control section, the stabilization of the polishing process and the optimization of wafer sampling can be achieved.

While the present invention has been described in terms of its application to the polishing apparatus provided with the two polishing lines and the one cleaning line, the present invention is also applicable to apparatuses having other constructions. The transport control according to the present can be generally applied to polishing apparatuses having "m" polishing lines and "n" cleaning lines, provided "m>n". In carrying out control according to the present invention, cleaning time may be represented either by the time of a cleaning machine whose cleaning time is the longest of all the cleaning machines of a cleaning line or by a cleaning machine whose cleaning time is the longest of all the cleaning machines of a cleaning line. Which cleaning time to take is determined in consideration of the construction of the apparatus, the processing capacity of the control section, etc.

The present invention can be applied even to a polishing apparatus having one polishing line and one cleaning line. In particular, the present invention is applicable when the sum of polishing time and transport time is longer than cleaning time, that is, when the cleaning time is a rate-controlling factor.

The following is an embodiment of the calculation of predicted polishing start time for the 2nd and subsequent wafers from the initiation of polishing: Time at which a transport unit in a cleaning line is next driven is calculated and predicted from cleaning time. Wait time is calculated by subtracting the sum of polishing time and transport time from the cleaning time. For the 2nd and subsequent wafers, the start of first polishing or second polishing is delayed by the wait time. In this embodiment, the cleaning time is represented by the cleaning time of a cleaning machine whose cleaning time is the longest of all the cleaning machines of the cleaning line. Either a fixed time or an average time may be employed as the polishing time.

In order to minimize the time period between the termination of second polishing and the start of cleaning, it is possible to calculate "predicted cleaning start time" and "data on wafer position in the cleaning line 40 upon arrival of a wafer at the first cleaning machine 42a" (hereinafter referred to as "wafer map") for all the uncleaned wafers fed into the polishing apparatus and, based on the data, control the timing of starting polishing so that, after the termination of second polishing, the wafers can reach the second reversing machine 52b without a wait time.

When a scheduled uncleaned wafer has not actually arrived at the second reversing machine 52b at the termination of a cleaning process in the cleaning machines 42a to 42d, it is possible to set an interlock in the operation of the transport unit 44 so as to stop the operation of the transport unit 44 and not to start the next cleaning process until the wafer arrives at the second reversing machine 52b.

Figure 9:
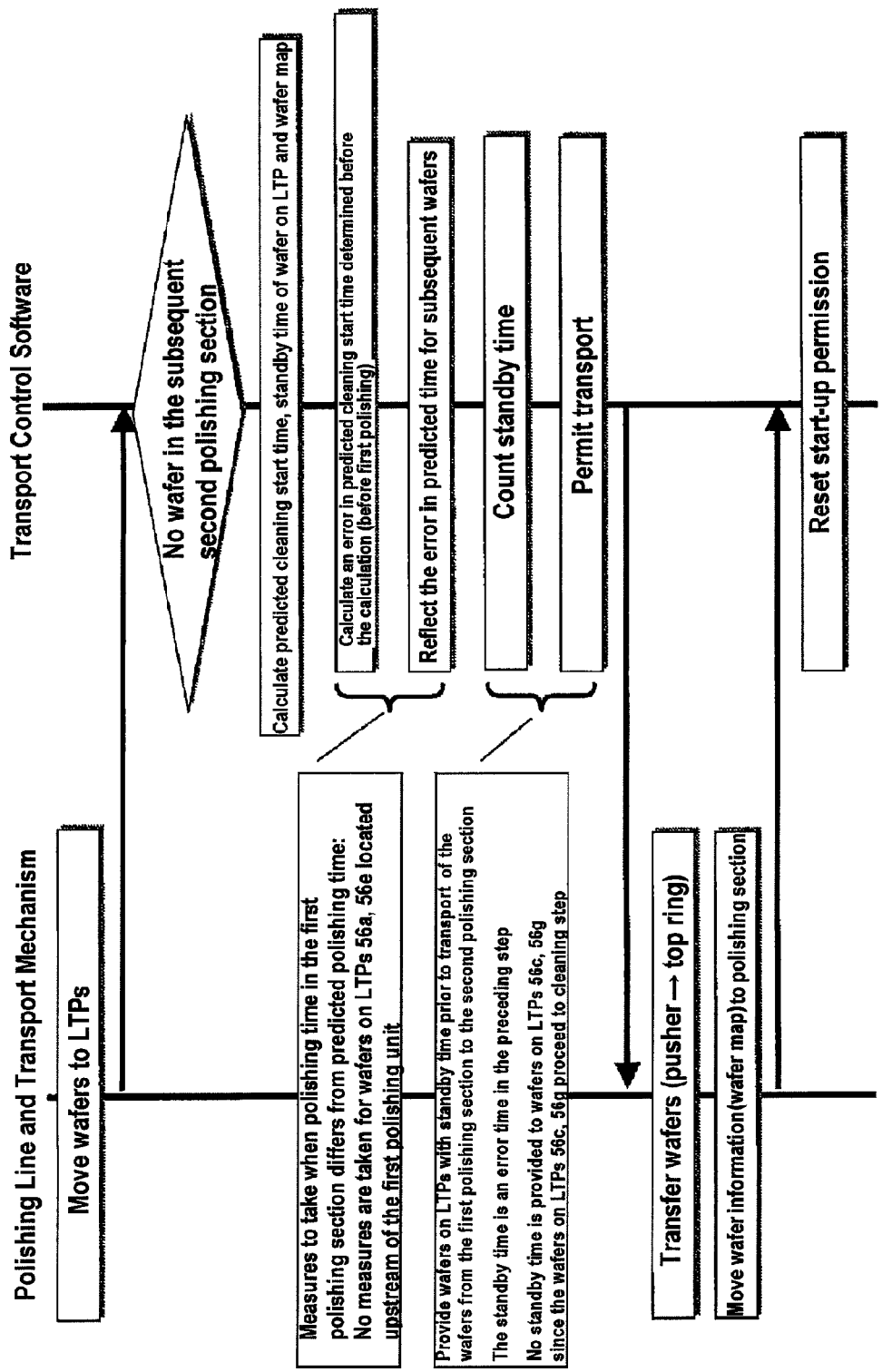
FIG. 9 is a flow chart illustrating relationship of a polishing line and a transport mechanism to a transport control software which controls transport of a wafer such that the wafer reaches a second reversing machine without a wait time after the termination of second polishing.

FIG. 9 shows relationship of the polishing lines 20, 30 and the transport mechanism 50 to a transport control software which controls transport of a wafer such that the wafer reaches the second reversing machine 52b without a wait time. As shown in FIG. 9, the transport control software, upon receipt of a signal sent when each wafer has moved to any one of the linear transporters (LTP) 56a to 56c and 56e to 56g, determines presence or absence of a wafer in the second polishing section 24 or 34 relevant to that linear transporter and, when a wafer is absent, calculates (1) predicted cleaning start time, (2) standby time of wafer on each of the linear transporters (LTP) 56a to 56c and 56e to 56g and (3) a wafer map for each wafer. The calculation method differs whether a wafer is present or absent in the cleaning line 40, as described in detail below.

(a) When a Wafer is Absent in the Cleaning Line 40

In this case, the predicted cleaning start time is calculated by adding "transport time from current position to the second reversing machine 52b" to "current time". The standby time of wafer on each of the linear transporters (LTP) 56a to 56c and 56e to 56g is "0". The wafer map is such that a wafer being calculated is in the first cleaning machine 42a, while the second to fourth cleaning machines 42b to 42d are empty.

Figure 10:
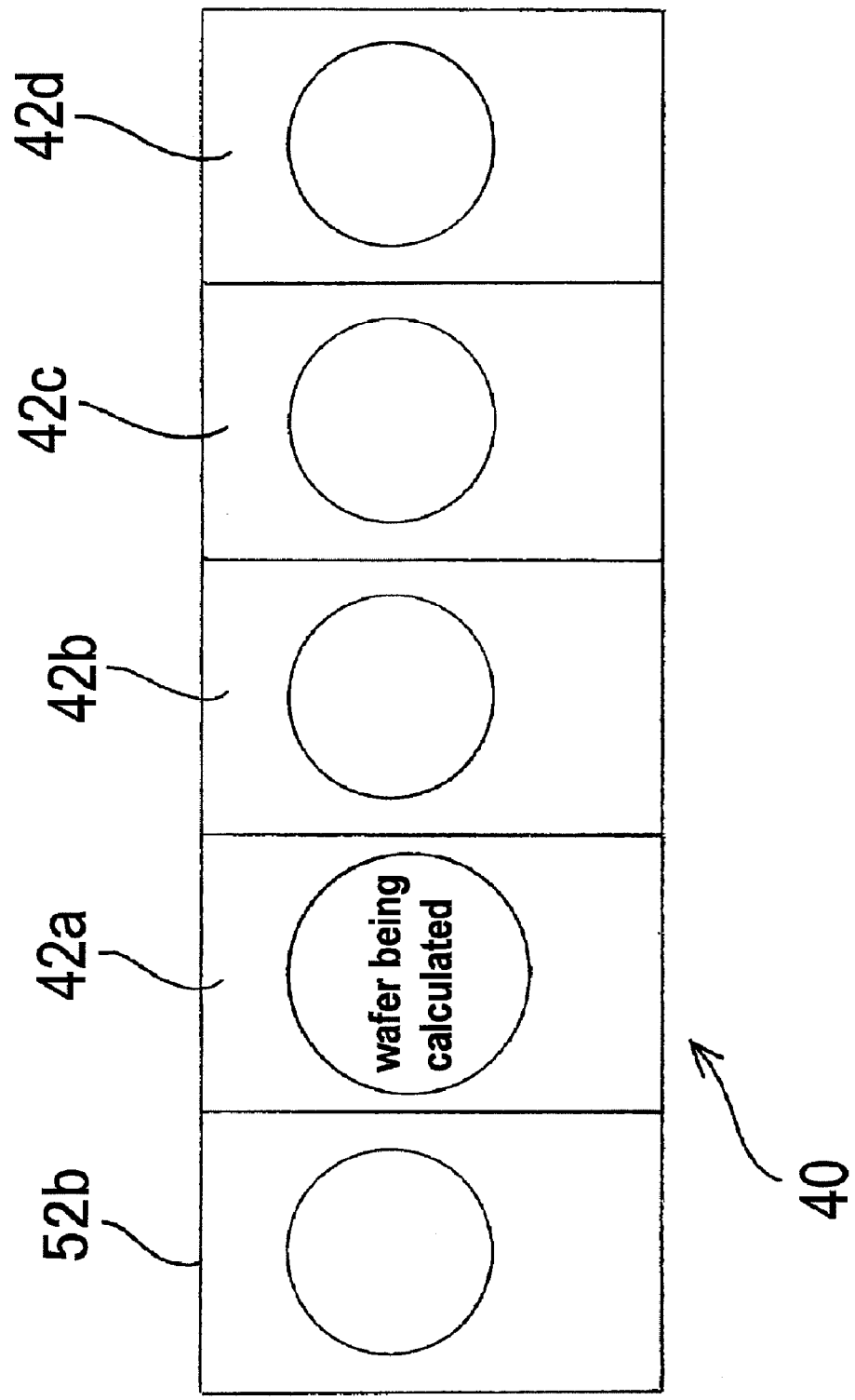
FIG. 10 is a diagram showing a wafer map in which a wafer being calculated is on a first cleaning machine, while second to fourth cleaning machines are empty.

A wafer map is an imaginary picture which indicates which processing a wafer(s) will be undergoing after time "n" when the next wafer to be cleaned is to arrive at the second reversing machine 52b, assuming that the process proceeds as scheduled. FIG. 10 shows a wafer map in which a wafer being calculated is in the first cleaning machine 42a, while the second to fourth cleaning machines 42b to 42d are empty.

(b) When a Wafer is Present in the Cleaning Line 40

In this case, the minimum "N" (N=1, 2 . . . ) that satisfies the following formula (1) is first determined:

$$\text{"Current time"} + \text{"transport time from current position to the second reversing machine } 52b\text{"} \leq \text{"predicted cleaning start time for preceding wafer"} + \text{"predicted cleaning tact time"} \times N \quad (1)$$

Depending on the value "N", the predicted cleaning start time, etc. is calculated as described below. Because the polishing apparatus of this embodiment is provided with the four cleaning machines 42a to 42d, the calculation is performed in different manners in the case of $1 \leq N \leq 3$ and in the case of $4 \leq N$ with the value 3, which is one smaller than the number of the cleaning machines, as a boundary value.

(i) In the Case of $1 \leq N \leq 3$

In this case, the predicted cleaning start time is calculated by adding "predicted cleaning tact time"×N to "predicted cleaning start time for preceding wafer" ("predicted cleaning start time for preceding wafer"+"predicted cleaning tact time"×N). The standby time of wafer on each of the linear transporters (LTP) 56a to 56c and 56e to 56g is calculated by subtracting the sum of "current time" and "transport time from current position to the second reversing machine 52b" from the "predicted cleaning start time" ["predicted cleaning start time"−("current time"+"transport time from current position to the second reversing machine 52b")]. The wafer map is such that a wafer map of the preceding wafer is shifted by "N", and a wafer being calculated is in the first cleaning machine 42a.

Figure 11A:
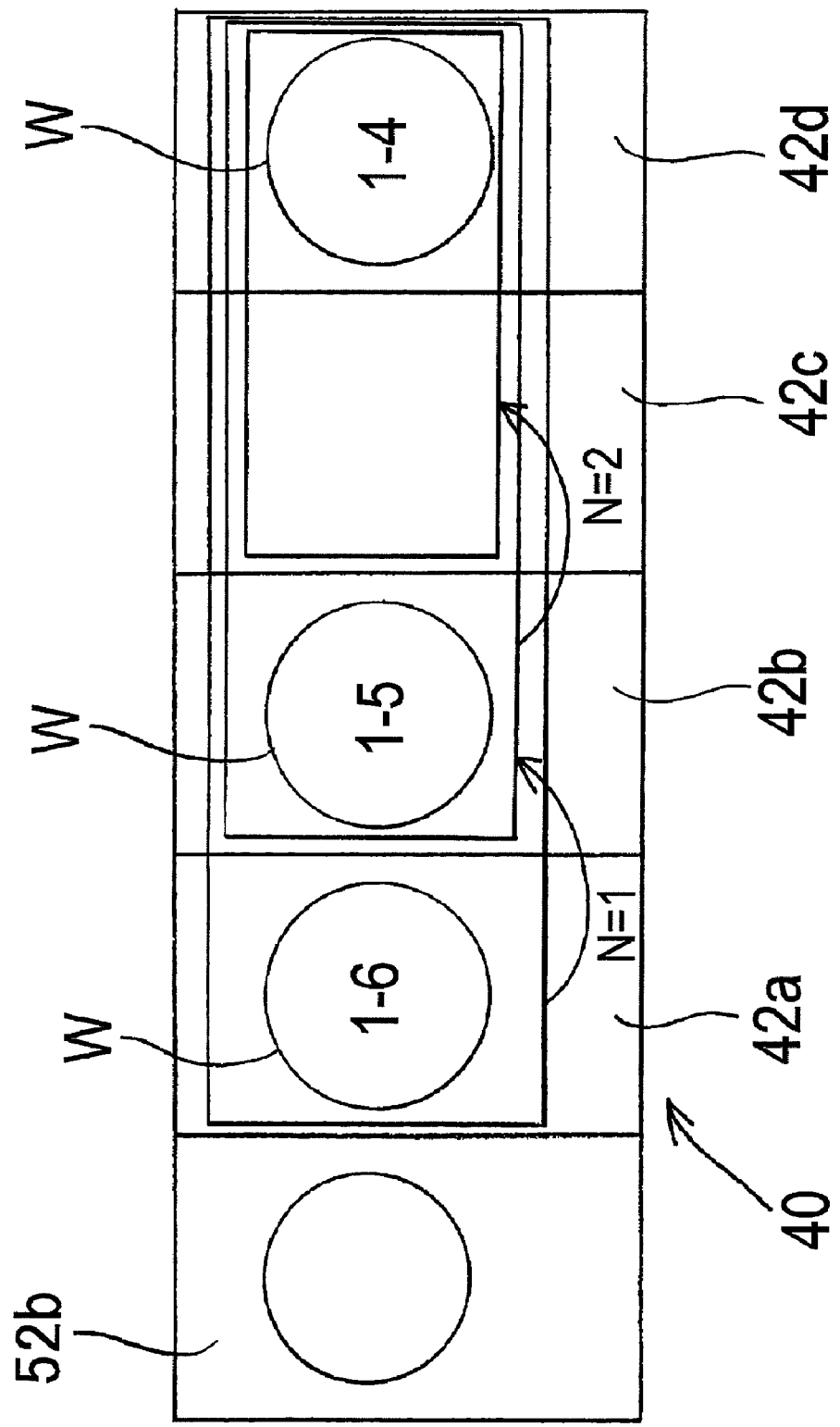
FIG. 11A is a diagram showing a wafer map of preceding wafers.

FIGS. 11A and 11B illustrate wafer maps before and after shifting the wafer map of the preceding wafer by "2", i.e., when N=2. In particular, in the wafer map of the preceding wafer, wafer 1-6 and wafer 1-5 are in the first cleaning machine 42a and the second cleaning machine 42b, respectively, and wafer 1-4 is in the fourth cleaning machine 42d, as shown in FIG. 11A. In the case of N=2, the wafer 1-6 and the wafer 1-5 are first transported to the second cleaning machine 42b and the third cleaning machine 42c, respectively, and the wafer 1-4 is transported out of the fourth cleaning machine 42d (N=1); and then the wafer 1-6 and the wafer 1-5 are transported to the third cleaning machine 42c and the fourth cleaning machine 42d, respectively (N=2). Thus, as shown in FIG. 11B, a wafer being calculated is in the first cleaning machine 42a with the wafers 1-6 and 1-5 in the third cleaning machine 42c and the fourth cleaning machine 42d.

(ii) In the Case of $4 \leq N$

In this case, a wafer being calculated is not influenced by the cleaning tact time of the preceding wafer. Accordingly, the predicted cleaning start time, the standby time of wafer on each of the linear transporters (LTP) 56a to 56c and 56e to 56g and the wafer map are calculated in the same manner as when a wafer is absent in the cleaning line.

The above-mentioned "predicted cleaning start time for preceding wafer" refers to the predicted cleaning start time for a wafer to be carried into the first cleaning machine 42a just one wafer before a wafer being calculated for its predicted cleaning start time. When an uncleaned wafer being calculated for its predicted cleaning start time is absent in the polishing apparatus, the actual value of final cleaning start time is employed as the "predicted cleaning start time for preceding wafer". Thus, a cleaning start flag is turned on when opening the shutter of the cleaning unit 40, and that time is stored by a transport control task. Further, cleaning tact time is calculated based on information on wafer position in the cleaning machine at that point in time.

"Cleaning tact time" can be calculated by adding transport time in the transport unit 44 to the longest cleaning time of the cleaning machines 42a to 42d. Even with the same cleaning recipe, the cleaning tact time may vary depending on the positions of wafers in the cleaning line. Accordingly, the "×N" in the above formula (1) does not simply apply in a strict sense. Therefore, cleaning tact time is actually calculated based on the wafer map of the preceding wafer.

In the preparation of a wafer map, if the above formula (1) holds true when subtracting a machine constant [parameter (sec) in calculation of cleaning start time] from the left-hand side of the formula (I), the wafer map is prepared with the use of "N" which applies then. The parameter is to increase the throughput by feeding a wafer into the cleaning line 40 and is, for example, about 5 seconds. The predicted cleaning start time is calculated using "N" that satisfies the formula (I).

A description will now be made of the calculation of "transport time from current position to the second reversing machine 52b" for a wafer when the wafer lies on any one of the linear transporters (LTP) 56a to 56c and 56e to 56g.

A. When the Wafer Lies on the Linear Transporter 56a

In this case, the "transport time from current position to the second reversing machine 52b" is the total sum of the following times:
  1) Descent time from the upper position to the lower position of the lifter 58a
  2) Exchange time in the linear transporters 56a to 58d
  3) Wafer transfer time from the pusher 60a to the top ring 22a
  4) Processing time in the first polishing section 22 of the first polishing line 20
  5) Wafer release time from the top ring 22a to the pusher 60a
  6) Exchange time in the linear transporters 56a to 58d
  7) Wafer transfer time from the pusher 60b to the top ring 24a
  8) Processing time in the second polishing section 24 of the first polishing line 20
  9) Wafer release time from the top ring 24a to the pusher 60b
  10) Exchange time in the linear transporters 56a to 58d
  11) Transport time for transporting the wafer from the lifter 58b to the second reversing machine 52b by the second transport robot 54b
  12) Operating time of the second reversing machine 52b An average value of processing time for wafers from the same cassette is employed as an average value in the same job for the "processing time in the first polishing section" and the "processing time in the second polishing section" and, for the first wafer of the job, an average value in a past process of the same recipe is employed. When such a past average value is not available, a recipe setting time (total processing time in the polishing step) is employed. This holds true for the below-described same terms.

B. When the Wafer Lies on the Linear Transporter 56b

In this case, the "transport time from current position to the second reversing machine 52b" is the total sum of the following times:
  1) Descent time of the pusher 60a
  2) Exchange time in the linear transporters 56a to 58d
  3) Wafer transfer time from the pusher 60b to the top ring 24a
  4) Processing time in the second polishing section 24 of the first polishing line 20
  5) Wafer release time from the top ring 24a to the pusher 60b
  6) Exchange time in the linear transporters 56a to 58d
  7) Transport time for transporting the wafer from the lifter 58b to the second reversing machine 52b by the second transport robot 54b
  8) Operating time of the second reversing machine 52b C. When the Wafer Lies on the Linear Transporter 56c In this case, the "transport time from current position to the second reversing machine 52b" is the total sum of the following times:
  1) Descent time of the pusher 60b
  2) Exchange time in the linear transporters 56a to 58d
  3) Transport time for transporting the wafer from the lifter 58b to the second reversing machine 52b by the second transport robot 54b
  4) Operating time of the second reversing machine 52b D. When the Wafer Lies on the Linear Transporter 56e In this case, the "transport time from current position to the second reversing machine 52b" is the total sum of the following times:
  1) Descent time from the upper position to the lower position of the lifter 58c
  2) Exchange time in the linear transporters 56e to 58g
  3) Wafer transfer time from the pusher 60c to the top ring 32a
  4) Processing time in the first polishing section 32 of the second polishing line 30
  5) Wafer release time from the top ring 32a to the pusher 60c
  6) Exchange time in the linear transporters 56e to 58g
  7) Wafer transfer time from the pusher 60d to the top ring 34a
  8) Processing time in the second polishing section 34 of the second polishing line 30
  9) Wafer release time from the top ring 34a to the pusher 60d
  10) Exchange time in the linear transporters 56e to 58g
  11) Transport time for transporting the wafer from the lifter 58c to the second reversing machine 52b by the second transport robot 54b
  12) Operating time of the second reversing machine 52b E. When the Wafer Lies on the Linear Transporter 56f In this case, the "transport time from current position to the second reversing machine 52b" is the total sum of the following times:
  1) Descent time of the pusher 60c
  2) Exchange time in the linear transporters 56e to 58g
  3) Wafer transfer time from the pusher 60c to the top ring 34a
  4) Processing time in the second polishing section 34 of the second polishing line 30
  5) Wafer release time from the top ring 34a to the pusher 60d
  6) Exchange time in the linear transporters 56e to 58g
  7) Transport time for transporting the wafer from the lifter 58c to the second reversing machine 52b by the second transport robot 54b
  8) Operating time of the second reversing machine 52b F. When the Wafer Lies on the Linear Transporter 56g In this case, the "transport time from current position to the second reversing machine 52b" is the total sum of the following times:
  1) Descent time of the pusher 60d
  2) Exchange time in the linear transporters 56e to 58g
  3) Transport time for transporting the wafer from the lifter 58c to the second reversing machine 52b by the second transport robot 54b
  4) Operating time of the second reversing machine 52b Returning to FIG. 9, after calculating (1) predicted cleaning start time, (2) standby time of wafer on each of the linear transporters (LTP) 56a to 56c and 56e to 56g and (3) a wafer map for each wafer in the above-described manner, an error in the predicted cleaning start time between before the calculation (before the first polishing) and after the calculation is calculated, and the error is reflected in the predicted time for subsequent wafers. This arithmetic processing is to deal with the case where the polishing time in the first polishing section 22 or 32 differs from the predicted polishing time; the processing is not performed for a wafer lying on the linear transporter 56a or 56e located upstream of the first polishing section 22 or 32.

The transport control software, after counting the standby time, sends a transport permission signal to the transport mechanism. As described above, standby time is set for each linear transporter prior to transport of a wafer from the first polishing section 22 or 32 to the second polishing section 24 or 34. This standby time corresponds to an error time in the preceding step. A wafer lying on the linear transporter 56c or 56g proceeds to a cleaning step thereafter, and therefore the above processing of the transport control software is not performed for the wafer lying on the linear transporter 56c or 56g.

Upon receipt of the transport permission, the transport mechanism transfers a wafer from each pusher to each top ring, and moves wafer information (wafer map) to the polishing section. The transport control software, upon receipt of a wafer information movement signal from the polishing section, resets start-up permission.

Figure 12:
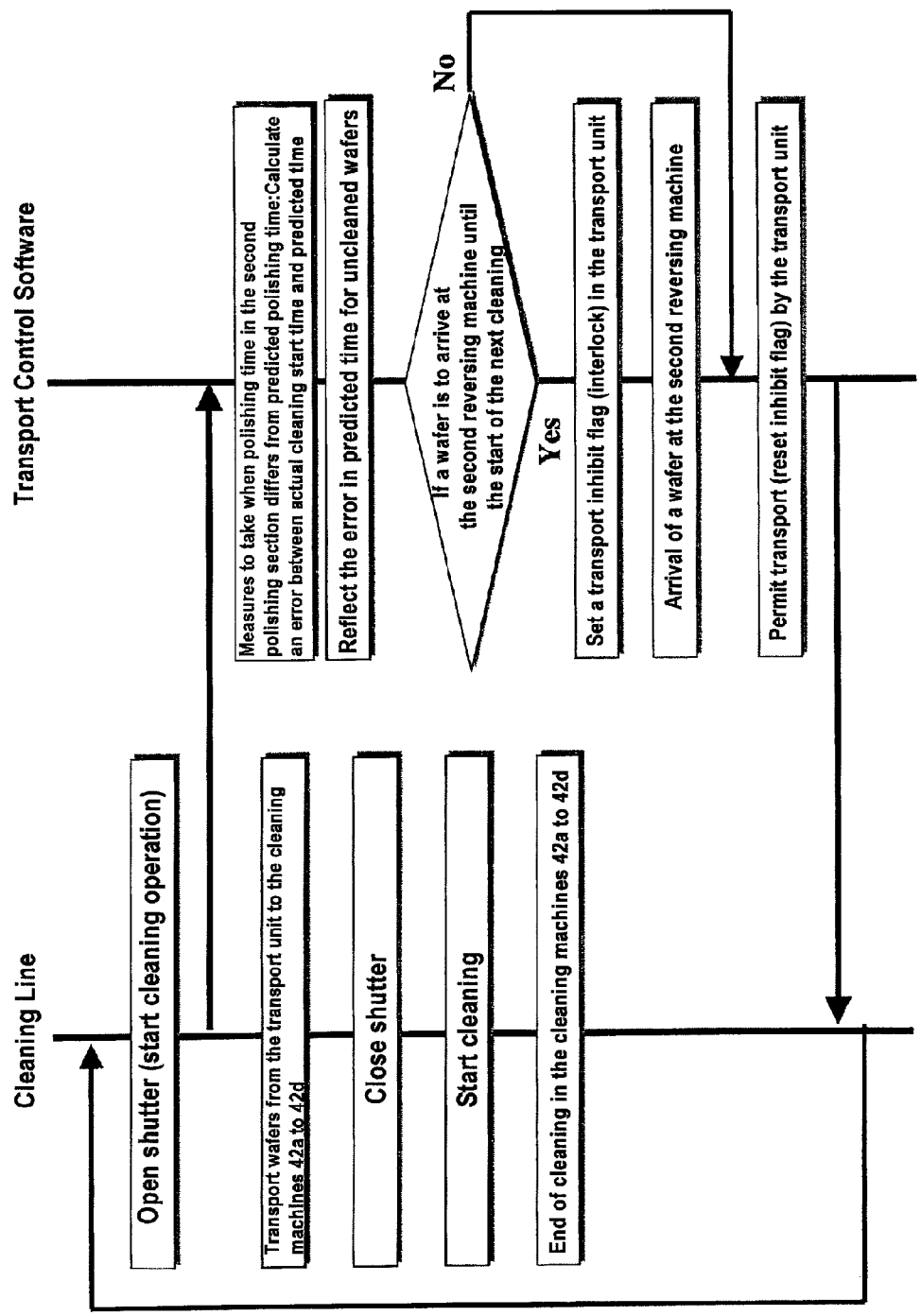
FIG. 12 is a flow chart illustrating relationship between a cleaning unit and the transport control software.

The relationship between the cleaning unit 40 and the transport control software will now be described with reference to FIG. 12.

The cleaning line 40, after opening the shutter, drives the transport unit 44 to simultaneously transport a wafer in the reversing machine 52b to the first cleaning machine 42a, a wafer in the first cleaning machine 42a to the second cleaning machine 42b, a wafer in the second cleaning machine 42b to the third cleaning machine 42c, and a wafer in the third cleaning machine 42c to the fourth cleaning machine 42d. After closing the shutter, a sequence of transport/cleaning operations, including starting cleaning, carrying out cleaning in accordance with cleaning recipes for the first to four cleaning machines 42a to 42d and terminating the cleaning, are carried out.

In order to deal with the case where the second polishing time in the second polishing section 34 or 44 differs from the predicted polishing time, the transport control software, upon receipt of a shutter opening (cleaning operation start) signal of the cleaning line 40, calculates the error between the actual cleaning start time and the predicted time and reflects the error in the predicted time for an uncleaned wafer.

The transport control software determines if any wafer is to arrive at the second reversing machine 52b till the next predicted cleaning start time and, if a wafer is to arrive, sets a transport inhibit flag (interlock) for inhibiting transport in the cleaning line 40. Upon detection of the arrival of a wafer at the second reversing machine 52b, the transport control software sends a transport permission (inhibit flag reset) signal to the cleaning line 40. On the other hand, if no wafer is to arrive, the software sends a transport permission (inhibition flag reset) signal to the cleaning line 40.

Upon receipt of a transport permission signal from the transport control software, the cleaning line 40 performs the sequence of transport/cleaning operations.

A description will now be made of procedures for instantly stopping all the units of the polishing apparatus when a serious failure (abnormal transport) has occurred in one of the units. In this case, the predicted cleaning start time for a wafer (s), lying upstream of the unit in which the serious failure (abnormal transport) has occurred, is turned into an invalid value (e.g., −1) so that the predicted time will not be referred to in the calculation of predicted cleaning start time for subsequent wafers. The transport control task sends the wafer (s), for which the predicted cleaning start time has been made invalid, to a scrapping process or to re-polishing without permitting transfer of the wafer(s) from a linear transporter to a top ring.

For example, when a serious failure has occurred in the linear transporters 56a to 56d, predicted cleaning start time is turned into an invalid value for wafers lying in the linear transporter 56c, the second polishing section 24 of the first polishing line 20, the linear transporter 56b, the first polishing section 22 and the linear transporter 56a.

When a serious failure has occurred in the first polishing section 22 of the first polishing line 20 as the pusher 60a is in the lowered position, predicted cleaning start time is turned into an invalid value for wafers lying in the first polishing section 22 and the linear transporter 56a.

When a serious failure has occurred in the first polishing section 22 of the first polishing line 20 as the pusher 60a is in the raised position, predicted cleaning start time is turned into an invalid value for wafers lying in the linear transporter 56c, the second polishing section 24, the linear transporter 56b, the first polishing section 22 and the linear transporter 56a.

When a serious failure has occurred in the second polishing section 24 of the first polishing line 20 as the pusher 60b is in the lowered position, predicted cleaning start time is turned into an invalid value for wafers lying in the second polishing section 24, the linear transporter 56b, the first polishing section 22 and the linear transporter 56a.

When a serious failure has occurred in the second polishing section 24 of the first polishing line 20 as the pusher 60b is in the raised position, predicted cleaning start time is turned into an invalid value for wafers lying in the linear transporter 56c, the second polishing section 24, the linear transporter 56b, the first polishing section 22 and the linear transporter 56a.

When a serious failure has occurred in the linear transporters 56e to 56g, predicted cleaning start time is turned into an invalid value for wafers lying in the linear transporter 56g, the second polishing section 34 of the second polishing line 30, the linear transporter 56f, the first polishing section 32 and the linear transporter 56e.

When a serious failure has occurred in the first polishing section 32 of the second polishing line 30 as the pusher 60c is in the lowered position, predicted cleaning start time is turned into an invalid value for wafers lying in the first polishing section 32 and the linear transporter 56e.

When a serious failure has occurred in the first polishing section 32 of the second polishing line 30 as the pusher 60c is in the raised position, predicted cleaning start time is turned into an invalid value for wafers lying in the linear transporter 56g, the second polishing section 34, the linear transporter 56f, the first polishing section 32 and the linear transporter 56e.

When a serious failure has occurred in the second polishing section 34 of the second polishing line 30 as the pusher 60d is in the lowered position, predicted cleaning start time is turned into an invalid value for wafers lying in the second polishing section 34, the linear transporter 56f, the first polishing section 32 and the linear transporter 56e.

When a serious failure has occurred in the second polishing section 34 of the second polishing line 30 as the pusher 60d is in the raised position, predicted cleaning start time is turned into an invalid value for wafers lying in the linear transporter 56g, the second polishing section 34, the linear transporter 56f, the first polishing section 32 and the linear transporter 56e.

When a serious failure has occurred downstream of the second transport robot 54b, predicted cleaning start time is turned into an invalid value for wafers lying in the linear transporters 56a to 56c and 56e to 56f, the first polishing sections 22, 32 and the second polishing sections 24, 34.

When a process interlock has occurred in some unit, all the wafers that are present in the polishing apparatus upon the interlock are processed without feeding a new wafer into the polishing apparatus. Further, the predicted cleaning start time for a wafer(s), lying upstream of the unit in which the process interlock has occurred, is turned into an invalid value (e.g., −1) so that the predicted time will not be referred to in the calculation of predicted cleaning start time for subsequent wafers. When a wafer, whose predicted cleaning start time has been made invalid, lies on a linear transporter, the transport control task does not permit the operation of transferring the wafer from the linear transporter to a top ring.

For example, when a process interlock has occurred in the first polishing section 22 of the first polishing line 20, predicted cleaning start time is turned into an invalid value for a wafer lying in the linear transporter 56a.

When a process interlock has occurred in the second polishing section 24 of the first polishing line 20, predicted cleaning start time is turned into an invalid value for wafers lying in the linear transporter 56b, the first polishing section 22 and the linear transporter 56a.

When a process interlock has occurred in the first polishing section 32 of the second polishing line 30, predicted cleaning start time is turned into an invalid value for a wafer lying in the linear transporter 56e.

When a process interlock has occurred in the second polishing section 34 of the second polishing line 30, predicted cleaning start time is turned into an invalid value for wafers lying in the linear transporter 56f, the first polishing section 32 and the linear transporter 56e.

When a temporary stop (pause) of operation for a wafer lying in some unit of the polishing apparatus has occurred, the predicted cleaning start time for a wafer(s), lying upstream of the unit in which the wafer in pause lies, is turned into an invalid value (e.g., −1) so that the predicted time will not be referred to in the calculation of predicted cleaning start time for subsequent wafers. When a wafer, whose predicted cleaning start time has been made invalid, lies on a linear transporter, the transport control task does not permit the operation of transferring the wafer from the linear transporter to a top ring.

For example, when the wafer in pause lies in the first polishing section 22 of the first polishing line 20, predicted cleaning start time is turned into an invalid value for wafers lying in the first polishing section 22 and the linear transporter 56a.

When the wafer in pause lies in the linear transporter 56b, predicted cleaning start time is turned into an invalid value for wafers lying in the linear transporter 56b, the first polishing section 22 and the linear transporter 56a.

When the wafer in pause lies in the second polishing section 24 of the first polishing line 20, predicted cleaning start time is turned into an invalid value for wafers lying in the second polishing section 24, the linear transporter 56b, the first polishing section 22 and the linear transporter 56a.

When the wafer in pause lies in the linear transporter 56c, predicted cleaning start time is turned into an invalid value for wafers lying in the linear transporter 56c, the second polishing section 24, the linear transporter 56b, the first polishing section 22 and the linear transporter 56a.

When the wafer in pause lies in the first polishing section 32 of the second polishing line 30, predicted cleaning start time is turned into an invalid value for wafers lying in the first polishing section 32 and the linear transporter 56e.

When the wafer in pause lies in the linear transporter 56f, predicted cleaning start time is turned into an invalid value for wafers lying in the linear transporter 56f, the first polishing section 32 and the linear transporter 56e.

When the wafer in pause lies in the second polishing section 34 of the second polishing line 30, predicted cleaning start time is turned into an invalid value for wafers lying in the second polishing section 34, the linear transporter 56f, the first polishing section 32 and the linear transporter 56e.

When the wafer in pause lies in the linear transporter 56g, predicted cleaning start time is turned into an invalid value for wafers lying in the linear transporter 56g, the second polishing section 34, the linear transporter 56f, the first polishing section 32 and the linear transporter 56e.

When the wafer in pause lies downstream of the second transport robot 54b, predicted cleaning start time is turned into an invalid value for wafers lying in the linear transporters 56a to 56c and 56e to 56f, the first polishing sections 22, 32 and the second polishing sections 24, 34.

Upon restart after a serious failure, a process interlock or a temporary stop of operation, recalculation of predicted cleaning start time is performed only those wafers whose predicted times have been made invalid. The recalculation is performed in order from a wafer whose transport time to the second reversing machine 52b is the shortest.

The transport times to the second reversing machine 52b from the respective positions are as follows:

A. First Polishing Section 22 of the First Polishing Line 20

The transport time to the second reversing machine 52b from the first polishing section 22 of the first polishing line 20 is the total sum of the following times:

1) Processing time in the first polishing section 22 of the first polishing line 20
2) Wafer release time from the top ring 22a to the pusher 60a
3) Exchange time in the linear transporters 56a to 56d
4) Wafer transfer time from the pusher 60b to the top ring 24a
5) Processing time in the second polishing section 24 of the first polishing line 20
6) Wafer release time from the top ring 24a to the pusher 60b
7) Exchange time in the linear transporters 56a to 56d
8) Transport time for transporting a wafer from the lifter 58c to the second reversing machine 52b by the second transport robot 54b
9) Operating time of the second reversing machine 52b For the processing time in the first polishing section 22 of the first polishing line 20 and for the processing time in the second polishing section 24, the above-described average value in the same job is employed when the processing is before "touchdown" (before contact of a top ring with a polishing table, i.e., before the initiation of polishing) and, for the first wafer of the job, an average value in a past process of the same recipe is employed. When such a past average value is not available, a recipe setting time (total processing time in the polishing step) is employed. When the processing is after touchdown, the processing time is set at "0". This holds also for the below-mentioned processing time in the first polishing section 32 or the second polishing section 34 of the second polishing line 30.

B. Second Polishing Section 24 of the First Polishing Line 20

The transport time to the second reversing machine 52b from the second polishing section 24 of the first polishing line 20 is the total sum of the following times:

1) Processing time in the second polishing section 24 of the first polishing line 20
2) Wafer release time from the top ring 24a to the pusher 60b
3) Exchange time in the linear transporters 56a to 56d
4) Transport time for transporting a wafer from the lifter 58c to the second reversing machine 52b by the second transport robot 54b
5) Operating time of the second reversing machine 52b C. First Polishing Section 32 of the Second Polishing Line 30

The transport time to the second reversing machine 52b from the first polishing section 32 of the second polishing line 30 is the total sum of the following times:

1) Processing time in the first polishing section 32 of the second polishing line 30
2) Wafer release time from the top ring 32a to the pusher 60c
3) Exchange time in the linear transporters 56e to 56g
4) Wafer transfer time from the pusher 60d to the top ring 34a
5) Processing time in the second polishing section 34 of the second polishing line 30
6) Wafer release time from the top ring 34a to the pusher 60d
7) Exchange time in the linear transporters 56e to 56g
8) Transport time for transporting a wafer from the lifter 58c to the second reversing machine 52b by the second transport robot 54b
9) Operating time of the second reversing machine 52b D. Second Polishing Section 34 of the Second Polishing Line 30

The transport time to the second reversing machine 52b from the second polishing section 34 of the second polishing line 30 is the total sum of the following times:

1) Processing time in the second polishing section 34 of the second polishing line 30
2) Wafer release time from the top ring 34a to the pusher 60d
3) Exchange time in the linear transporters 56e to 56g
4) Transport time for transporting a wafer from the lifter 58c to the second reversing machine 52b by the second transport robot 54b
5) Operating time of the second reversing machine 52b As described above, "predicted cleaning start time" and "data on wafer position in the cleaning line 40 upon arrival of a wafer at the first cleaning machine 42a" (wafer map) are calculated for all the uncleaned wafers fed into the polishing apparatus and, based on the data, the timing of starting polishing is controlled so that after the termination of second polishing, the wafers can reach the second reversing machine 52b without await time. This makes it possible to minimize the time period between the termination of second polishing and the start of cleaning.

While the present invention has been described with reference to the embodiments thereof, it will be understood by those skilled in the art that the present invention is not limited to the particular embodiments described above, but it is intended to cover modifications within the inventive concept.

INDUSTRIAL APPLICABILITY

The present invention can be applied to a polishing apparatus for polishing a polishing object, such as a semiconductor wafer, into a flat mirror-like surface and to a program stored in a control section of the polishing apparatus.

The invention claimed is:

1. A polishing apparatus comprising:
   a loading section for placing therein a cassette in which a plurality of polishing objects are housed;
   a first polishing line and a second polishing line for polishing a polishing object;
   a cleaning line having a cleaning machine for cleaning the polishing object after polishing and a transport unit for transporting the polishing object;
   a transport mechanism for transporting the polishing object between the loading section, the polishing lines and the cleaning line; and
   a control section for controlling the polishing lines, the cleaning line and the transport mechanism,
   wherein the control section determines a polishing start time in each of the first and second polishing lines based on a predicted polishing time in each of the first and second polishing lines, a predicted transport time in the transport mechanism, a predicted cleaning time in the cleaning line and a predicted cleaning start time to start cleaning by driving the transport unit of the cleaning line.

2. The polishing apparatus according to claim 1, wherein the predicted cleaning start time for a polishing object to be first polished is determined by adding the predicted polishing time and the predicted transport time to current time, and the predicted cleaning start time for a polishing object subsequent to the polishing object to be first polished is determined by adding the predicted cleaning time to the predicted cleaning start time for the preceding polishing object.

3. The polishing apparatus according to claim 1, wherein the first and second polishing lines each have a first polishing section and a second polishing section, and
   wherein the predicted polishing time in each polishing line is the total sum of a predicted polishing time in the first polishing section, a predicted polishing time in the second polishing section and a predicted transport time taken for transporting the polishing object in the polishing line from the first polishing section to the second polishing section.

4. The polishing apparatus according to claim 3, wherein when the actual polishing time in the first polishing section is longer than the predicted polishing time in the first polishing section, the control section delays the predicted cleaning start time by the delay time in the first polishing.

5. The polishing apparatus according to claim 4, wherein the control section performs an arithmetic processing to reflect the delay time as a polishing wait time for the second polishing section in subsequent polishing objects.

6. The polishing apparatus according to claim 3, wherein when the actual polishing time in the second polishing section is longer than the predicted polishing time in the second polishing section, the control section delays the predicted cleaning start time by the delay time in the second polishing.

7. The polishing apparatus according to claim 6, wherein the control section performs an arithmetic processing to reflect the delay time as a polishing wait time for the second polishing section in subsequent polishing objects.

8. The polishing apparatus according to claim 1, wherein the control section determines a polishing wait time by subtracting a predicted polishing end time in the case of zero wait time from the predicted cleaning start time.

9. The polishing apparatus according to claim 8, wherein when the polishing wait time is positive, the control section delays a polishing start time in the first polishing section or the second polishing section by the polishing wait time.

10. The polishing apparatus according to claim 8, wherein when the polishing wait time is zero, the control section determines a polishing start time in the first polishing section by subtracting the sum of the predicted polishing time and the predicted transport time from the predicted cleaning start time.

11. The polishing apparatus according to claim 8, wherein when the polishing wait time is negative, the control section delays the predicted cleaning start time by the absolute value of the polishing wait time.

12. The polishing apparatus according to claim 1, wherein the cleaning line has at least two cleaning machines, and the cleaning time of a cleaning machine whose cleaning time is the longest of the cleaning machines is employed as the predicted cleaning time.

13. The polishing apparatus according to claim 12, wherein the transport unit has a mechanism for simultaneously transporting a plurality of polishing objects.

14. The polishing apparatus according to claim 1, wherein the polishing object has a surface metal film.

15. The polishing apparatus according to claim 14, wherein the metal film is a copper film.

16. A polishing apparatus comprising:
a loading section for placing therein a cassette in which a plurality of polishing objects are housed;
a plurality of polishing lines for polishing a polishing object;
a cleaning line having a cleaning machine for cleaning the polishing object after polishing and a transport unit for transporting the polishing object;
a transport mechanism for transporting the polishing object between the loading section, the polishing lines and the cleaning line; and
a control section for controlling the polishing lines, the cleaning line and the transport mechanism,
wherein the control section determines a polishing wait time by subtracting a predicted polishing end time in the case of zero wait time from a predicted cleaning start time in the cleaning line and, when the polishing wait time is positive, delays a polishing start time in each of the polishing lines by the polishing wait time.

17. The polishing apparatus according to claim 16, wherein the polishing object has a surface metal film.

18. A polishing apparatus comprising:
a loading section for placing therein a cassette in which a plurality of polishing objects are housed;
a polishing line having a plurality of polishing sections for polishing a polishing object;
a cleaning line having a plurality of cleaning machines for cleaning the polishing object after polishing and a transport unit for transporting the polishing object;
a transport mechanism for transporting the polishing object between the loading section, the polishing line and the cleaning line; and
a control section for controlling the polishing line, the cleaning line and the transport mechanism,
wherein the control section determines a polishing wait time by subtracting a predicted polishing end time in the case of zero wait time from a predicted cleaning start time in the cleaning line and, when the polishing wait time is positive, delays a polishing start time in the polishing line by the polishing wait time.

19. The polishing apparatus according to claim 18, wherein the polishing object has a surface metal film.

20. A program stored in a control section of a polishing apparatus, which comprises:
a loading section for placing therein a cassette in which a plurality of polishing objects are housed;
a first polishing line and a second polishing line for polishing a polishing object;
a cleaning line having a cleaning machine for cleaning the polishing object after polishing and a transport unit for transporting the polishing object;
a transport mechanism for transporting the polishing object between the loading section, the polishing lines and the cleaning line; and
the control section for controlling the polishing lines, the cleaning line and the transport mechanism,
wherein the program causes a computer to execute a procedure to determine a polishing start time in each of the first and second polishing lines based on a predicted polishing time in each of the first and second polishing lines, a predicted transport time in the transport mechanism, a predicted cleaning time in the cleaning line and a predicted cleaning start time to start cleaning by driving the transport unit of the cleaning line.

21. The program according to claim 20, wherein the program causes the computer to execute a procedure to determine the predicted cleaning start time for a polishing object to be first polished by adding the predicted polishing time and the predicted transport time to current time, and determine the predicted cleaning start time for a polishing object subsequent to the polishing object to be first polished by adding the predicted cleaning time to the predicted cleaning start time for the preceding polishing object.

22. The program according to claim 20, wherein the first and second polishing lines each have a first polishing section and a second polishing section, and
wherein the program causes the computer to execute a procedure to determine the predicted polishing time by the total sum of a predicted polishing time in the first polishing section, a predicted polishing time in the second polishing section and a predicted transport time taken for transporting the polishing object in the polishing line from the first polishing section to the second polishing section.

23. The program according to claim 22, wherein when the actual polishing time in the first polishing section is longer than the predicted polishing time in the first polishing section, the program causes the computer to execute a procedure to delay the predicted cleaning start time by the delay time in the first polishing.

24. The program according to claim 23, wherein the program causes the computer to execute an arithmetic processing to reflect the delay time as a polishing wait time for the second polishing section in subsequent polishing objects.

25. The program according to claim 22, wherein when the actual polishing time in the second polishing section is longer than an average value of polishing time in the second polishing section, the program causes the computer to execute a procedure to delay the predicted cleaning start time by the delay time in the second polishing.

26. The program according to claim 25, wherein the program causes the computer to execute an arithmetic processing to reflect the delay time as a polishing wait time for the second polishing section in subsequent polishing objects.

27. The program according to claim 20, wherein the program causes the computer to execute a procedure to determine a polishing wait time by subtracting a predicted polishing end time in the case of zero wait time from the predicted cleaning start time.

28. The program according to claim 27, wherein when the polishing wait time is positive, the program causes the computer to execute a procedure to delay a polishing start time in the first polishing section or the second polishing section by the polishing wait time.

29. The program according to claim 27, wherein when the polishing wait time is zero, the program causes the computer to execute a procedure to determines a polishing start time in the first polishing section by subtracting the sum of the predicted polishing time and the predicted transport time from the predicted cleaning start time.

30. The program according to claim 27, wherein when the polishing wait time is negative, the program causes the computer to execute a procedure to delay the predicted cleaning start time by the absolute value of the polishing wait time.

31. The program according to claim 20, wherein the cleaning line has at least two cleaning machines, and
wherein the program causes the computer to execute a procedure to employ the cleaning time of a cleaning machine whose cleaning time is the longest of the cleaning machines as the predicted cleaning time.

32. A program stored in a control section of a polishing apparatus, which comprises:
a loading section for placing therein a cassette in which a plurality of polishing objects are housed;
a plurality of polishing lines for polishing a polishing object;
a cleaning line having a cleaning machine for cleaning the polishing object after polishing and a transport unit for transporting the polishing object;
a transport mechanism for transporting the polishing object between the loading section, the polishing lines and the cleaning line;
and the control section for controlling the polishing lines, the cleaning line and the transport mechanism,
wherein the program causes a computer to execute a procedure to determine a polishing wait time by subtracting a predicted polishing end time in the case of zero wait time from a predicted cleaning start time in the cleaning line and, when the polishing wait time is positive, delay a polishing start time in each of the polishing lines by the polishing wait time.

33. A program stored in a control section of a polishing apparatus, which comprises:
a loading section for placing therein a cassette in which a plurality of polishing objects are housed;
a polishing line having a plurality polishing sections for polishing a polishing object;
a cleaning line having a plurality of cleaning machines for cleaning the polishing object after polishing and a transport unit for transporting the polishing object;
a transport mechanism for transporting the polishing object between the loading section, the polishing line and the cleaning line; and
the control section for controlling the polishing line, the cleaning line and the transport mechanism,
wherein the program causes a computer to execute a procedure to determine a polishing wait time by subtracting a predicted polishing end time in the case of zero wait time from a predicted cleaning start time in the cleaning line and, when the polishing wait time is positive, delay a polishing start time in the polishing line by the polishing wait time.

* * * * *